(12) United States Patent  
Zhou et al.

(10) Patent No.: US 12,373,005 B2  
(45) Date of Patent: Jul. 29, 2025

(54) FLEXIBLE DISPLAY PANEL, DISPLAY, AND ELECTRONIC DEVICE

(71) Applicant: HONOR DEVICE CO., LTD., Shenzhen (CN)

(72) Inventors: Yawei Zhou, Shenzhen (CN); Zhifei Tian, Shenzhen (CN); Yan Zhang, Shenzhen (CN); Fan Luo, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 18/017,183

(22) PCT Filed: Sep. 2, 2022

(86) PCT No.: PCT/CN2022/116905  
§ 371 (c)(1),  
(2) Date: Jan. 20, 2023

(87) PCT Pub. No.: WO2023/093195  
PCT Pub. Date: Jun. 1, 2023

(65) Prior Publication Data  
US 2024/0231435 A1    Jul. 11, 2024

(30) Foreign Application Priority Data

Nov. 29, 2021  (CN) .......................... 202111436962.8  
Jan. 29, 2022  (CN) .......................... 202210113128.3

(51) Int. Cl.  
*G06F 1/16*    (2006.01)  
*H10K 59/80*   (2023.01)  
(Continued)

(52) U.S. Cl.  
CPC ......... *G06F 1/1652* (2013.01); *H10K 59/872* (2023.02); *H10K 77/111* (2023.02); *H10K 2102/311* (2023.02)

(58) Field of Classification Search  
CPC ............ G06F 1/1652; H10K 2102/311; H10K 77/111; H10K 59/872  
See application file for complete search history.

(56) References Cited

U.S. PATENT DOCUMENTS

| 7,319,291 B2 * | 1/2008 | Fujitani ................... H01J 11/12 313/586 |
| 11,922,843 B2 | 3/2024 | Wang et al. |

(Continued)

FOREIGN PATENT DOCUMENTS

| CN | 110992831 A | 4/2020 |
| CN | 111048699 A | 4/2020 |

(Continued)

*Primary Examiner* — Ariel A Balaoing  
(74) *Attorney, Agent, or Firm* — WOMBLE BOND DICKINSON (US) LLP

(57) ABSTRACT

A flexible display panel includes a main view portion, and a first side view portion, a second side view portion, and a third side view portion that are disposed at an edge of the main view portion, where the third side view portion is connected between the first side view portion and the second side view portion; and the first side view portion, the second side view portion, and the third side view portion respectively extend from a first section, a second section, and a corner section of the main view portion in a direction leaving a middle portion of the main view portion and bend toward a back face side.

20 Claims, 18 Drawing Sheets

(51) Int. Cl.
    *H10K 77/10*     (2023.01)
    *H10K 102/00*    (2023.01)

(56) References Cited

U.S. PATENT DOCUMENTS

| | | | |
|---|---|---|---|
| 2014/0092564 A1* | 4/2014 | Chuang | H05K 13/00 |
| | | | 29/829 |
| 2015/0109544 A1 | 4/2015 | Yeo et al. | |
| 2017/0149940 A1 | 5/2017 | Moon et al. | |
| 2018/0368270 A1* | 12/2018 | Seo | G06F 1/16 |
| 2019/0081127 A1* | 3/2019 | Shim | H10K 77/111 |
| 2019/0377385 A1* | 12/2019 | Bushnell | G06F 3/044 |
| 2020/0057525 A1* | 2/2020 | Prest | H04R 3/12 |
| 2020/0160761 A1* | 5/2020 | Ahn | H10K 50/844 |
| 2020/0401185 A1* | 12/2020 | Won | B32B 37/30 |
| 2021/0337677 A1 | 10/2021 | Lin et al. | |
| 2022/0163831 A1* | 5/2022 | Noh | G02F 1/133305 |
| 2022/0208898 A1* | 6/2022 | Cho | H10K 59/12 |
| 2023/0156106 A1* | 5/2023 | Qin | H04M 1/0269 |
| | | | 361/679.01 |

FOREIGN PATENT DOCUMENTS

| | | |
|---|---|---|
| CN | 111385390 A | 7/2020 |
| CN | 210927685 U | 7/2020 |
| CN | 111710245 A | 9/2020 |
| CN | 112311914 A | 2/2021 |
| CN | 112311967 A | 2/2021 |
| CN | 112565485 A | 3/2021 |
| CN | 112732013 A | 4/2021 |
| CN | 112909040 A | 6/2021 |
| CN | 113053236 A | 6/2021 |
| WO | 2021196909 A1 | 10/2021 |

\* cited by examiner

FLEXIBLE DISPLAY PANEL, DISPLAY, AND ELECTRONIC DEVICE

CROSS-REFERENCE TO RELATED APPLICATIONS

This application is a national stage of International Application No. PCT/CN2022/116905, filed on Sep. 2, 2022, which claims priority to Chinese Patent Application No. 202111436962.8, filed on Nov. 29, 2021, and Chinese Patent Application No. 202210113128.3, filed on Jan. 29, 2022. The disclosures of each of the aforementioned applications are hereby incorporated by reference in their entireties.

TECHNICAL FIELD

This application relates to the field of display technologies, and in particular, to a flexible display panel, a display, and an electronic device.

BACKGROUND

At present, electronic devices such as mobile phones and tablet computers are becoming seriously homogeneous in appearance. A display (also referred to as a screen) is an important part of an electronic device, and a different shape of the display is an important factor that distinguishes the electronic device from other brands of products. In addition, with the improvement of living standards, users have a growing demand for increased screen-to-body ratios of displays.

To enhance product competitiveness and increase screen-to-body ratios of displays, electronic devices are gradually moving towards curved screens. However, in a common electronic device with a curved screen, to avoid wrinkles in an internal flexible display panel, the flexible display panel has curved shapes on two sides of the display, but not at the top and the bottom. In this case, frame sides at the top and the bottom are directly tiled under coverglass (coverglass, CG), so that the screen-to-body ratio of such electronic device cannot be further increased. In addition, because the flexible display panel is not curved at the top and the bottom, the electronic device with such curved screen has a fixed appearance, resulting in poor product competitiveness and user experience.

SUMMARY

Embodiments of this application provide a flexible display panel, a display, and an electronic device, to address an issue about how to increase a screen-to-body ratio and product competitiveness of the electronic device.

To achieve the foregoing objective, the following technical solutions are used in the embodiments of this application.

According to a first aspect, a flexible display panel is provided. The flexible display panel includes a main view portion, and a first side view portion, a second side view portion, and a third side view portion that are disposed at an edge of the main view portion. The main view portion includes a middle portion and an edge. The edge of the main view portion includes a first section, a second section, and a corner section connected between the first section and the second section. The main view portion includes a display face and a back face that is back to the display face. The first side view portion extends from the first section in a direction leaving the middle portion of the main view portion and bends toward a back face side. The second side view portion extends from the second section in a direction leaving the middle portion of the main view portion and bends toward the back face side. The third side view portion is connected between the first side view portion and the second side view portion, and the third side view portion extends from the corner section in a direction leaving the middle portion of the main view portion and bends toward the back face side.

In this way, the flexible display panel is not only provided with a curved shape on the side, the top, or the bottom, but also provided with a curved shape at an edge corner. When such flexible display panel is applied to an electronic device, it is unnecessary to form an upwarp corner on a middle frame, thereby reducing processing difficulty of the middle frame. In addition, the flexible display panel is disposed in the curved shape on the side, the top, or the bottom of a light-transmitting cover plate, and is also disposed in a curved shape at a corner of an edge of the light-transmitting cover plate. Therefore, a black edge width of a corner of a front face of the electronic device is consistent with a black edge width of the side, the top, or the bottom, ensuring that the front face of the electronic device looks good. In addition, the screen-to-body ratio of the electronic device can be further increased, improving information carrying efficiency of a display region and enhancing product competitiveness.

In a possible implementation of the first aspect, two ends of an outer contour of the third side view portion respectively connect to an outer contour of the first side view portion and an outer contour of the second side view portion, and a middle portion of the outer contour of the third side view portion upwarps toward the main view portion in a direction perpendicular to the main view portion. In this way, a part located between an upwarp part in the middle portion of the outer contour of the third side view portion and the corner section forms a redundant part at the edge corner of the flexible display panel. The redundant part is in an unfolded state without any wrinkles. When such flexible display panel is applied to the electronic device, a display effect of the electronic device is not affected.

In a possible implementation of the first aspect, an orthographic projection of the outer contour of the first side view portion on the display face is a first projection. An orthographic projection of the outer contour of the second side view portion on the display face is a second projection. An orthographic projection of the outer contour of the third side view portion on the display face is a third projection. The third projection is a transition arc connected between the first projection and the second projection. In this way, when such flexible display panel is applied to an electronic device such as a mobile phone, edge corners of the front face of the electronic device are in a round corner shape, ensuring aesthetics and better meeting use habits of users.

In a possible implementation of the first aspect, an orthographic projection of the third side view portion on the display face is a fourth projection, and an intersection of an extending line of the first section and an extending line of the second section is located within the fourth projection. In this way, the third side view portion has a large area, and therefore has a large orthographic projection on the display face, which can further improve the screen-to-body ratio of the electronic device.

In a possible implementation of the first aspect, a height of the third side view portion in the direction perpendicular to the main view portion is greater than or equal to 0.05 mm and less than or equal to 0.25 mm. In this way, the flexible display panel has a moderate redundancy on the third side view portion, preventing the flexible display panel from generating wrinkles as far as possible while maintaining the curved shape of the flexible display panel.

In a possible implementation of the first aspect, both the first section and the second section are straight sections, and the first section is perpendicular to the second section.

In a possible implementation of the first aspect, the corner section is a transition arc connected between the first section and the second section. In this way, the edge of the main view portion has a smooth transition; and the first side view portion, the third side view portion, and the second side view portion that are disposed at the edge of the main view portion can transit smoothly in sequence, preventing damage to the flexible display panel caused by an excessively large bent angle between the first side view portion and the third side view portion, between the third side view portion and the second side view portion, and inside the third side view portion.

In a possible implementation of the first aspect, a length of the first section is greater than a length of the second section.

According to a second aspect, a display is further provided. The display includes a light-transmitting cover plate and the flexible display panel described in any one of the foregoing technical solutions. The light-transmitting cover plate includes a flat plate portion, and a first arc sheet portion, a second arc sheet portion, and a third arc sheet portion that are disposed at an edge of the flat plate portion. The flat plate portion includes a middle portion and an edge. The edge of the flat plate portion includes a first edge, a second edge, and a corner edge connected between the first edge and the second edge. The first arc sheet portion extends from the first edge of the flat plate portion in a direction leaving the middle portion of the flat plate portion and bends toward an inner side of the flat plate portion. The second arc sheet portion extends from the second edge of the flat plate portion in a direction leaving the middle portion of the flat plate portion and bends toward the inner side of the flat plate portion. The third arc sheet portion is connected between the first arc sheet portion and the second arc sheet portion, and the third arc sheet portion extends from the corner edge of the flat plate portion in a direction leaving the middle portion of the flat plate portion and bends toward the inner side of the flat plate portion. The flexible display panel is disposed on an inner side of the light-transmitting cover plate. The main view portion of the flexible display panel and the flat plate portion are stacked, the display face of the main view portion faces toward the flat plate portion, and the first side view portion of the flexible display panel and the first arc sheet portion are stacked. The second side view portion of the flexible display panel and the second arc sheet portion are stacked. The third side view portion of the flexible display panel and the third arc sheet portion are stacked.

The display provided in this embodiment includes the flexible display panel described in any one of the foregoing embodiments. The flat plate portion, the first arc sheet portion, the second arc sheet portion, and the third arc sheet portion of the light-transmitting cover plate are respectively stacked with the main view portion, the first side view portion, the second side view portion, and the third side view portion of the flexible display panel, so that a curved display can be formed. In addition to a curved shape on the side, the top, or the bottom, the curved display is also provided with a curved shape at the edge corner. The curved shape at the edge corner may be used to display images or information, improving a screen-to-body ratio and product competitiveness.

In a possible implementation of the second aspect, two ends of an outer contour of the third arc sheet portion respectively connect to an outer contour of the first arc sheet portion and an outer contour of the second arc sheet portion, and a middle portion of the outer contour of the third arc sheet portion upwarps toward the flat plate portion in a direction perpendicular to the flat plate portion. In this way, the third arc sheet portion fits with the third side view portion of the flexible display panel, ensuring that they can be fitted together.

In a possible implementation of the second aspect, an orthographic projection of the outer contour of the first arc sheet portion on an outer surface of the flat plate portion is a fifth projection; an orthographic projection of the outer contour of the second arc sheet portion on the outer surface of the flat plate portion is a sixth projection; and an orthographic projection of the outer contour of the third arc sheet portion on the outer surface of the flat plate portion is a seventh projection. The seventh projection is a transition arc connected between the fifth projection and the sixth projection. In this way: when the light-transmitting cover plate is applied to an electronic device, edge corners of the light-transmitting cover plate are in a round corner shape on the front face of the electronic device, ensuring aesthetics and better meeting use habits of users.

In a possible implementation of the second aspect, an orthographic projection of the third arc sheet portion on the outer surface of the flat plate portion is an eighth projection, and an intersection of an extending line of the first edge and an extending line of the second edge is located in the eighth projection. In this way, the third arc sheet portion has a relatively large area and can cover the third side view portion to effectively protect the third side view portion.

In a possible implementation of the second aspect, the first arc sheet portion, the second arc sheet portion, and the third arc sheet portion each have a decreasing thickness from an end connecting to the flat plate portion to the outer contour. In this way, with an inner surface of the first arc sheet portion, an inner surface of the second arc sheet portion, and an inner surface of the third arc sheet portion respectively fitting with the first side view portion, the second side view portion, and the third side view portion of the flexible display panel, an outer surface of the first arc sheet portion, an outer surface of the second arc sheet portion, and an outer surface of the third arc sheet portion each have a larger radian, allowing a user to enjoy pictures with a more-3D effect.

In a possible implementation of the second aspect, a length of the first arc sheet portion in a direction parallel to the flat plate portion and perpendicular to the first edge is less than or equal to 6 mm. Optionally, the length may be 2 mm. 2.5 mm. 3 mm. 3.5 mm. 4 mm. 4.5 mm. 5 mm. 5.5 mm. 6 mm, or the like. In this way, when the light-transmitting cover plate is applied to an electronic device, the first arc sheet portion occupies a small area on the front face of the electronic device. Therefore, with a given display region, an area of the flat plate portion can be set larger, so that a user can view more images or information displayed on the flexible display panel from the flat plate portion, thereby reducing visual errors.

In a possible implementation of the second aspect, a length of the second arc sheet portion in a direction parallel to the flat plate portion and perpendicular to the second edge is less than or equal to 6 mm. Optionally, the length may be 1 mm. 1.5 mm. 2 mm. 2.5 mm. 3 mm. 3.5 mm. 4 mm, or the like. In this way: when the light-transmitting cover plate is applied to an electronic device, the second arc sheet portion occupies a small area on the front face of the electronic device. With a given display region, an area of the flat plate portion can be set larger, so that a user can view more information or images displayed on the flexible display panel from the flat plate portion, thereby reducing visual errors.

In a possible implementation of the second aspect, a height of the first arc sheet portion in a direction perpendicular to the flat plate portion is less than or equal to 3.5 mm. Optionally, the height may be 1 mm. 1.5 mm. 2 mm. 2.5 mm. 3 mm. 3.5 mm, or the like. As the height of the first arc sheet portion affects height of the light-transmitting cover plate, when the light-transmitting cover plate is applied to an electronic device, the height of the light-transmitting cover plate affects thickness of the electronic device. Therefore, when the height of the first arc sheet portion is less than or equal to 3.5 mm, such a small height allows the electronic device to be thinner.

In a possible implementation of the second aspect, a height of the second arc sheet portion in the direction perpendicular to the flat plate portion is less than or equal to 1.5 mm. Optionally, the height may be 0.5 mm. 0.8 mm. 1 mm. 1.1 mm. 1.2 mm. 1.3 mm. 1.4 mm. 1.5 mm, or the like. When the light-transmitting cover plate is applied to an electronic device, an outer edge of the second arc sheet portion covers a top edge or a bottom edge of the middle frame. On this basis, the height of the second arc sheet portion is less than or equal to 1.5 mm. With a given thickness of the electronic device, such a small height allows the middle frame to be designed thicker, facilitating arrangement of structures such as a USB interface, a speaker sound output hole, and an earphone jack on the top edge and the bottom edge of the frame.

In a possible implementation of the second aspect, an included angle between a tangent plane at an outer edge of the inner surface of the first arc sheet portion and the outer surface of the flat plate portion and an included angle between a tangent plane at an outer edge of the inner surface of the second arc sheet portion and the outer surface of the flat plate portion both are less than or equal to 89°. In this way, a user can enjoy pictures with a more-3D effect.

In a possible implementation of the second aspect, a curvature radius of the inner surface of the first arc sheet portion and a curvature radius of the inner surface of the second arc sheet portion both are greater than or equal to 2.5 mm. Optionally, each of the two curvature radii may be 2.5 mm. 3 mm. 3.5 mm. 4 mm, or the like. In this way, the inner surface of the first arc sheet portion and the inner surface of the second arc sheet portion have a large curvature radius, so that a bent angle is small in the case of bending a planar light-transmitting cover plate by hot pressing or other methods to form the first arc sheet portion and the second arc sheet portion. This can guarantee the forming yield of the first arc sheet portion and the second arc sheet portion. All parts of the inner surface of the first arc sheet portion and the inner surface of the second arc sheet portion may have the same or different curvature radii, which is not specifically limited in this embodiment of this application.

In a possible implementation of the second aspect, a height of the third arc sheet portion in the direction perpendicular to the flat plate portion is greater than or equal to 1 mm and less than or equal to 2 mm. In this way, the height of the third arc sheet portion is moderate, avoiding impact on a 3D display effect of an electronic device caused by a large upwarp in the middle of an outer edge of the third arc sheet portion.

According to a third aspect, an electronic device is further provided. The electronic device includes the display described in any one of the foregoing technical solutions, a middle frame, a back cover, and a circuit board. The back cover and the display are stacked, the middle frame is disposed between the back cover and the display, an inner accommodating space of the electronic device is formed between the middle frame and the back cover, the circuit board is disposed in the inner accommodating space, and the circuit board is electrically connected to the flexible display panel of the display.

Because the electronic device provided in this embodiment of this application includes the display described in the foregoing embodiment, the electronic device can implement four-curved display with a high screen-to-body ratio, making the product more competitive.

BRIEF DESCRIPTION OF DRAWINGS

FIG. 1b is an exploded view of the electronic device shown in FIG. 1a:

DESCRIPTION OF EMBODIMENTS

Figure 1A:
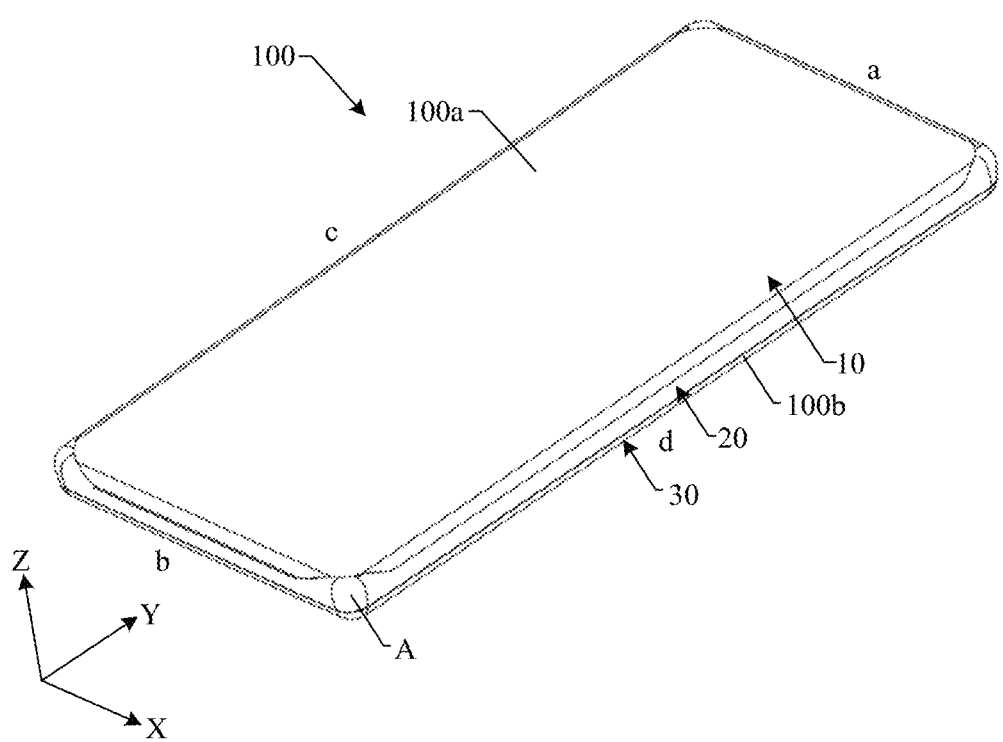
FIG. 1a is a three-dimensional diagram of an electronic device according to some embodiments of this application.

In the embodiments of this application, the terms "first", "second", "third", "fourth", "fifth", "sixth", "seventh", and "eighth" are merely intended for a purpose of description, and should not be understood as an indication or implication of relative importance or an implicit indication of a quantity of the indicated technical features. Therefore, a feature defined by "first", "second", "third", "fourth", "fifth", "sixth", "seventh", or "eighth" may explicitly or implicitly include one or more features.

In the embodiments of this application, the term "comprise", "include", or any of their variants are intended to cover a non-exclusive inclusion, so that a process, a method, an article, or an apparatus that includes a list of elements not only includes those elements but also includes other elements that are not expressly listed, or further includes elements inherent to such process, method, article, or apparatus. In the absence of more constraints, an element defined by "including a . . . " does not exclude another same element in a process, method, article, or apparatus that includes the element.

In the embodiments of this application, the term "and/or" is only an associative relationship for describing associated objects, indicating that three relationships may be present. For example, A and/or B may indicate three cases: presence of only A: presence of both A and B; and presence of only B. In addition, the character "/" in this specification generally represents an "or" relationship between the associated objects.

To improve a screen-to-body ratio and product competitiveness of an electronic device, on the basis that curved shapes are provided on two sides of a display, curved shapes can be additionally provided at the top and the bottom of the display, so as to form a four-curved screen shape. In this way, frame widths at the top and the bottom of the electronic device are further reduced on the basis of reducing frame widths on two sides, increasing the screen-to-body ratio of the electronic device and improving user experience of slide-up and pull-down operations on the display, thereby enhancing product competitiveness.

However, in an electronic device with a four-curved screen, the display generally includes a light-transmitting cover plate (for example, CG) and a flexible display panel. The light-transmitting cover plate has a four-curved shape. The flexible display panel is attached to an inner surface of the light-transmitting cover plate. As the flexible display panel is in a planar sheet shape before being attached to the inner surface of the light-transmitting cover plate, the flexible display panel has redundancy at an edge corner of the inner surface after being attached to the inner surface of the light-transmitting cover plate, which tends to generate wrinkles, and thus leads to poor appearance.

In order to prevent the flexible display panel from generating wrinkles while satisfying the four-curved shape of the electronic device, a part of the flexible display panel at the edge corner of the light-transmitting cover plate can be cut off.

Specifically, refer to FIG. 1a. FIG. 1a is a three-dimensional diagram of an electronic device 100 according to some embodiments of this application. The embodiment of this application and the following embodiments are all described by using an example in which the electronic device 100 is a curved-screen mobile phone, but this should not be considered as a specific limitation on this application. The electronic device 100 is in an approximately rectangular flat plate shape. For ease of description of the following embodiments, an XYZ coordinate system is established. A width direction of the electronic device 100 is defined as an X-axis direction, a length direction of the electronic device 100 is defined as a Y-axis direction, and a thickness direction of the electronic device 100 is defined as a Z-axis direction. It can be understood that the coordinate system of the electronic device 100 can be flexibly set based on actual needs, which is not specifically limited herein. In some other embodiments, the electronic device 100 may alternatively be in a square flat plate shape, a circular flat plate shape, an elliptical flat plate shape, or the like.

The electronic device 100 has a front face 100a and a back face 100b that are approximately perpendicular to the Z-axis direction. The front face 100a of the electronic device 100 has a display screen for displaying images or information. When the electronic device 100 is in use, the front face 100a of the electronic device 100 faces toward a user to display images or information to the user. The back face 100b of the electronic device 100 is back to the front face 100a of the electronic device 100. The back face 100b may be provided with structures such as a light-transmitting window of a rear-facing camera and a camera decoration part. The electronic device 100 also has a top portion a and a bottom portion b that are opposite each other, and a side portion c and a side portion d that are opposite each other. The top portion a and the bottom portion b are two end portions of the electronic device 100 in the Y-axis direction. The side portion c and the side portion d are two end portions of the electronic device 100 in the X-axis direction. When the electronic device 100 displays images or information to the user through the front face 100a, the top portion a is on the upper part of a field of view of the user, the bottom portion b is located on the lower part of the field of view of the user, and the side portion c and the side portion d are respectively located on two sides of the field of view of the user. The top portion a is generally provided with structures such as a front-facing camera, an earphone, and an earphone jack. The bottom portion b is generally provided with structures such as a speaker sound output hole and a universal serial bus (universal serial bus. USB) interface. The side portion d is generally provided with a side button.

Based on this, it should be noted that, in the following embodiments. "top portion" used for describing the components of the electronic device 100 is a portion constituting the top portion a of the electronic device 100 when the component described is applied to the electronic device 100 shown in FIG. 1a: "bottom portion" is a portion constituting the bottom portion b of the electronic device 100 when the component described is applied to the electronic device 100 shown in FIG. 1a; and "side portion" is a portion constituting the side portion c or the side portion d of the electronic device 100 when the component described is applied to the electronic device 100 shown in FIG. 1a. This does not indicate or imply that the apparatuses or components necessarily have specified orientations or are necessarily constructed and operated in the specified orientations, and therefore should not be understood as a limitation on this application.

Figure 1B:
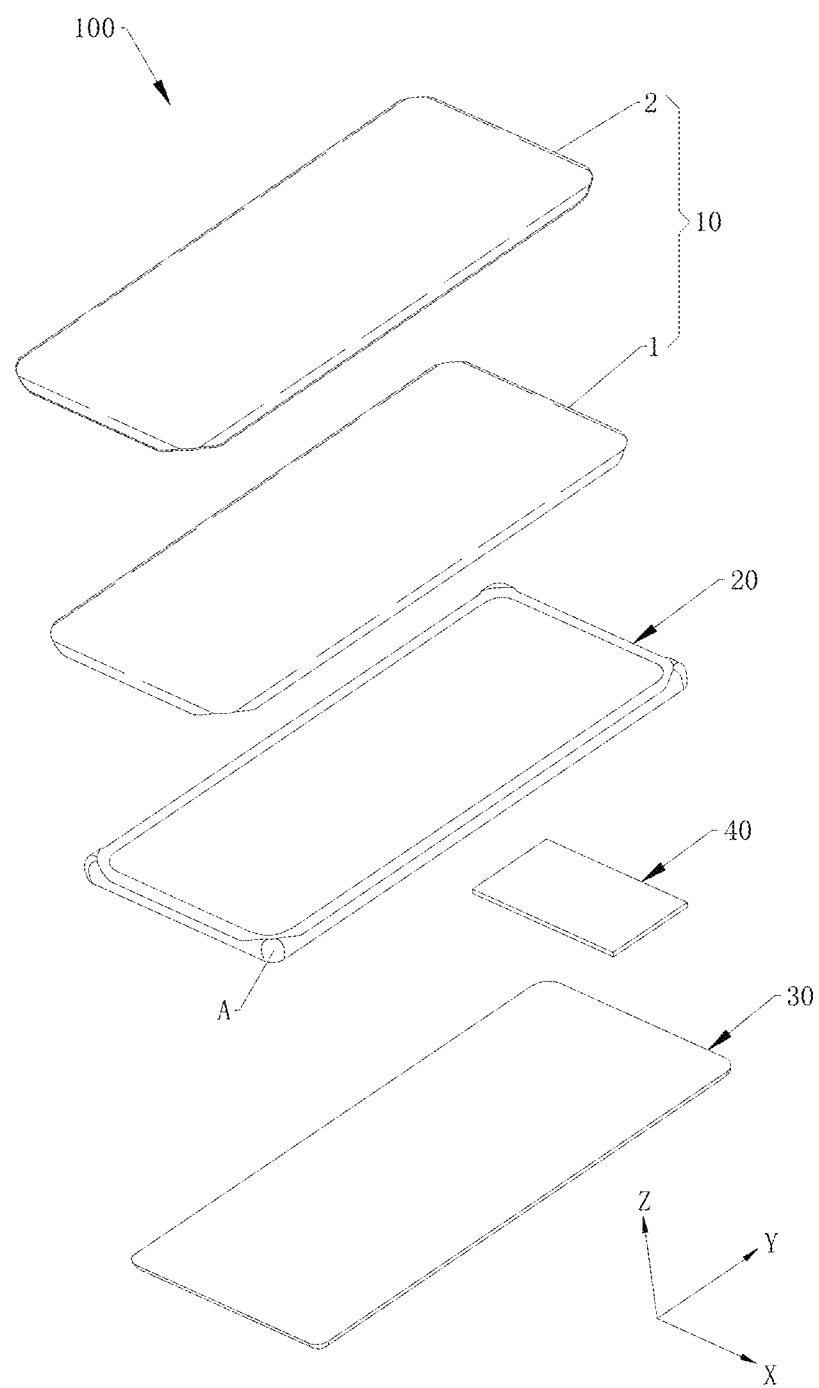

Refer to FIG. 1a and FIG. 1b. FIG. 1b is an exploded view of the electronic device 100 shown in FIG. 1a. The electronic device 100 includes a display 10, a middle frame 20, a back cover 30, and a circuit board 40. It should be understood that FIG. 1a. FIG. 1b, and the following relevant accompanying drawings merely show an example of some components included by the electronic device 100. Actual shapes, actual sizes, actual positions, and actual structures of these components are not limited by FIG. 1a. FIG. 1b, and the following accompanying drawings.

The display 10 is configured to display images, videos, and the like. Optionally, the display 10 includes a light-transmitting cover plate 2 and a flexible display panel 1 (panel in English). The light-transmitting cover plate 2 and the flexible display panel 1 are stacked, and fixedly connected by gluing or other manners. The light-transmitting cover plate 2 is mainly configured to provide protection and dust prevention for the flexible display panel 1. A material of the light-transmitting cover plate 2 includes but is not limited to plastic and glass. The flexible display panel 1 may be an organic light-emitting diode (organic light-emitting diode. OLED) display panel, an active-matrix organic light emitting diode or active-matrix organic light-emitting diode (active-matrix organic light-emitting diode. AMOLED) display panel, a mini light-emitting diode (mini organic light-emitting diode) display panel, a micro light-emitting diode (micro organic light-emitting diode) display panel, a micro organic light-emitting diode (micro organic light-emitting diode) display panel, a quantum dot light-emitting diode (quantum dot light emitting diodes, QLED), or the like.

The middle frame 20 is connected to the display 10. The middle frame 20 is used as a support frame for electronic components of the electronic device 100 and supports the display 10.

The back cover 30 is located on a side of the middle frame 20 further away from the display 10, and the back cover 30 is connected to the middle frame 20. An inner accommodating space of the electronic device 100 is formed between the middle frame 20 and the back cover 30.

Based on this, it should be noted that in the following embodiments, unless otherwise specified. "inner side" used describing the components of the electronic device 100 is a side of the described component closer to the inner accommodating space of the electronic device 100; "inner surface" is a surface of the described component closer to the inner accommodating space of the electronic device 100; "outer side" is a side of the described component further away from the inner accommodating space of the electronic device 100; and "outer surface" is a surface of the component described further away from the inner accommodating space of the electronic device 100. This does not indicate or imply that the apparatuses or components necessarily have specified orientations or are necessarily constructed and operated in the specified orientations, and therefore should not be understood as a limitation on this application.

The circuit board 40 is disposed in the inner accommodating space of the electronic device 100. The circuit board 40 may be a primary circuit board or a secondary circuit board. The circuit board 40 is electrically connected to the flexible display panel 1 of the display 10 to transmit images or information to the flexible display panel 1.

Figure 2:
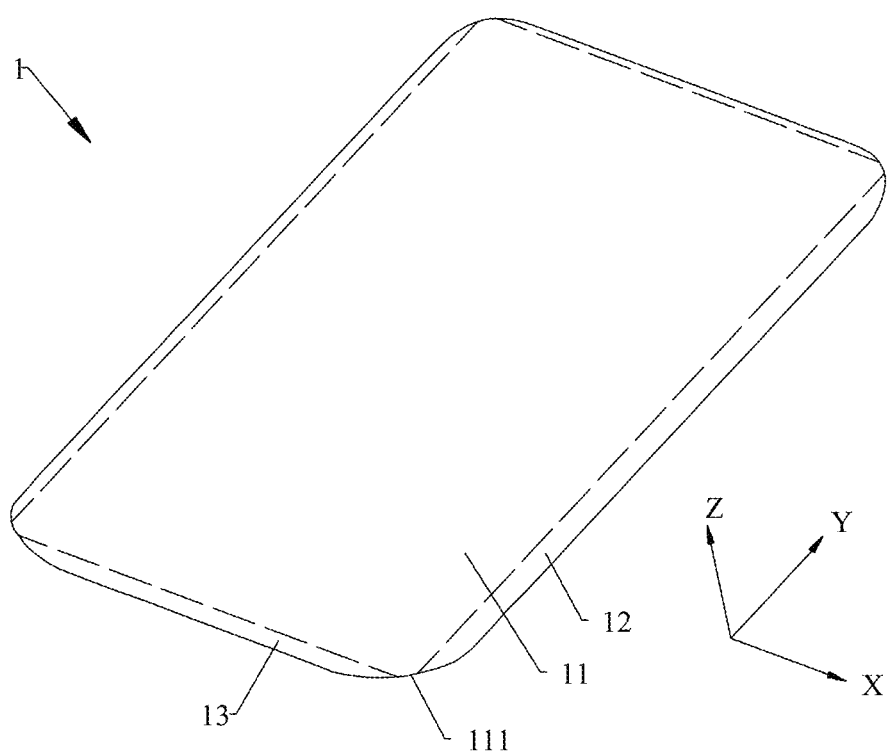
FIG. 2 is a three-dimensional diagram of an electronic device including the flexible display panel shown in FIG. 1.

Refer to FIG. 2. FIG. 2 is a schematic structural diagram of the flexible display panel 1 of the electronic device 100 shown in FIG. 1a and FIG. 1b. It should be noted that a coordinate system in FIG. 2 and the following accompanying drawings showing the flexible display panel are a same coordinate system as in FIG. 1a and FIG. 1b. To be specific, orientation relationships of all parts of the flexible display panel 1 in the coordinate system in FIG. 2 and the following accompanying drawings showing the flexible display panel are the same as orientation relationships of all parts in the flexible display panel 1 in the coordinate system in FIG. 1a and FIG. 1b when the flexible display panel 1 is applied to the electronic device 100 shown in FIG. 1a and FIG. 1b. The flexible display panel 1 includes a main view portion 11, and a first side view portion 12 and a second side view portion 13 that are disposed surrounding an edge of the main view portion 11. The main view portion 11 is provided with a middle portion and an edge, and the first side view portion 12 extends from an edge of an end of the main view portion 11 in the X-axis direction in a direction leaving the middle portion of the main view portion 11 and bends toward a back face side of the main view portion 11. The back face side of the main view portion 11 is a side of the main view portion 11 closer to the back face 100b of the electronic device 100 when the flexible display panel 1 is applied to the electronic device 100 shown in FIG. 1a and FIG. 1b. The second side view portion 13 extends from an edge of an end of the main view portion 11 in the Y-axis direction in a direction leaving the middle portion of the main view portion 11 and bends toward the back face side of the main view portion 11. In this way, when the flexible display panel 1 is applied to the display 10 of the electronic device 100 shown in FIG. 1a and FIG. 1b, the display 10 can present a four-curved shape. An outer contour of the main view portion 11 includes a corner section 111. One end of the corner section 111 connects to an outer contour of the first side view portion 12, and another end connects to an outer contour of the second side view portion 13. The corner section 111, the outer contour of the first side view portion 12, and the outer contour of the second side view portion 13 form an outer contour of the flexible display panel 1. In this way, an unfilled corner is formed at an edge corner of the flexible display panel 1, so that wrinkles are not generated at the corner when the flexible display panel 1 is attached to the inner surface of the four-curved light-transmitting cover plate.

When the flexible display panel 1 described in the foregoing embodiment is applied to the electronic device shown in FIG. 1a and FIG. 1b, an unfilled corner may also be formed at an edge corner of the light-transmitting cover plate 2. Certainly, the light-transmitting cover plate 2 may alternatively keep a complete four-curved shape. To be specific, two sides, the top, the bottom, and the edge corners of the light-transmitting cover plate each are provided with a curved shape. FIG. 1a and FIG. 1b show an example in which an unfilled corner is formed at an edge corner of the light-transmitting cover plate 2, which should not be considered as a specific limitation on a structure of the light-transmitting cover plate 2.

When an unfilled corner is also formed at an edge corner of the light-transmitting cover plate, as shown in FIG. 1a and FIG. 1b, the flexible display panel 1 and the light-transmitting cover plate 2 each are provided with an unfilled corner at an edge corner, and at the unfilled corner, the middle frame 20 needs to fill the unfilled corner, so that an upwarp corner A is formed on the middle frame 20, increasing processing difficulty of the middle frame 20.

Figure 3:
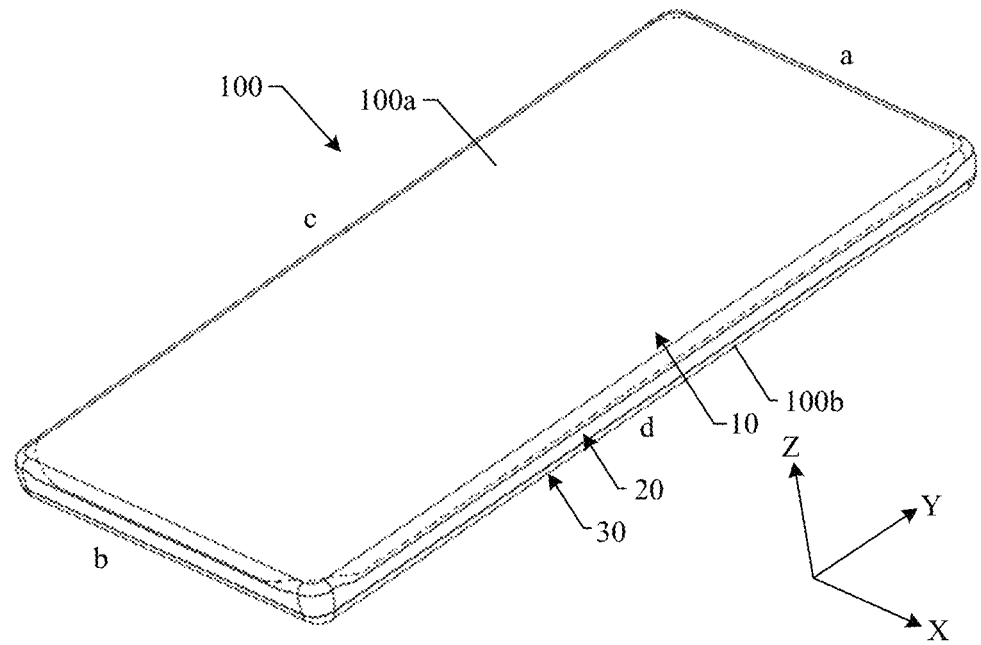
FIG. 3 is a three-dimensional diagram of another electronic device including the flexible display panel shown in FIG. 1.

When the light-transmitting cover plate keeps a complete four-curved shape, refer to FIG. 3. FIG. 3 is a three-dimensional diagram of another electronic device 100 including the flexible display panel 1 shown in FIG. 2. In this embodiment, an unfilled corner is formed at an edge corner of the flexible display panel 1, the light-transmitting cover plate 2 keeps the complete four-curved shape, and the edge corners of the flexible display panel 1 stay out of the edge corners of the light-transmitting cover plate 2. A black light shielding layer may be disposed on the inner surface of the edge corner of the light-transmitting cover plate 2 to shield an internal structure of the electronic device 100, thereby ensuring appearance consistency of the electronic device 100. In this way, a black edge at the edge corner of the light-transmitting cover plate 2 is wider than black edges of two sides, the top, and the bottom of the light-transmitting cover plate 2. When viewed from the front face 100a of the electronic device 100, a round corner at the edge of the light-transmitting cover plate does not match a round corner of a display region, affecting appearance of the electronic device 100.

Figure 4:
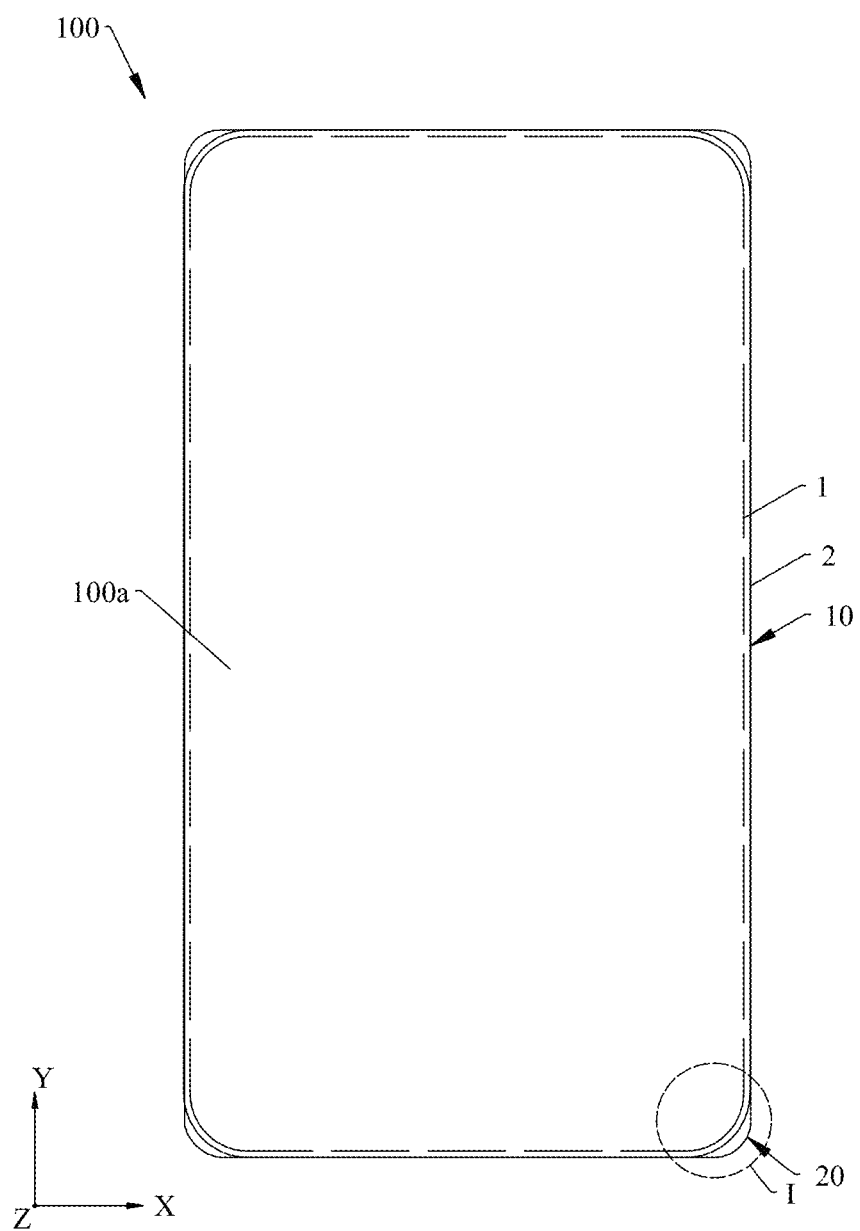
FIG. 4 is a main view of the electronic device shown in FIG. 2.
Figure 5:
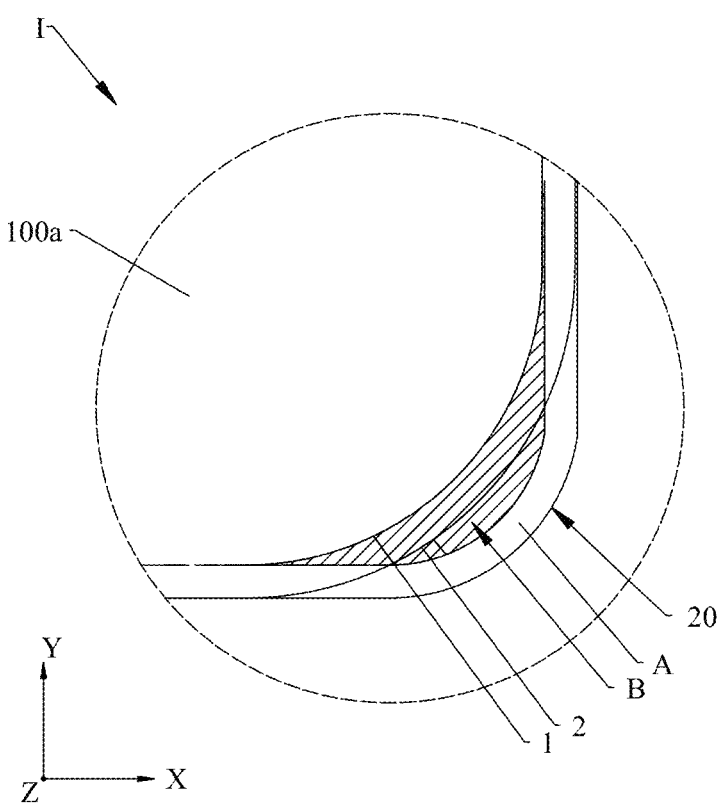
FIG. 5 is a locally enlarged view of region I of the electronic device shown in FIG. 4.
Figure 6:
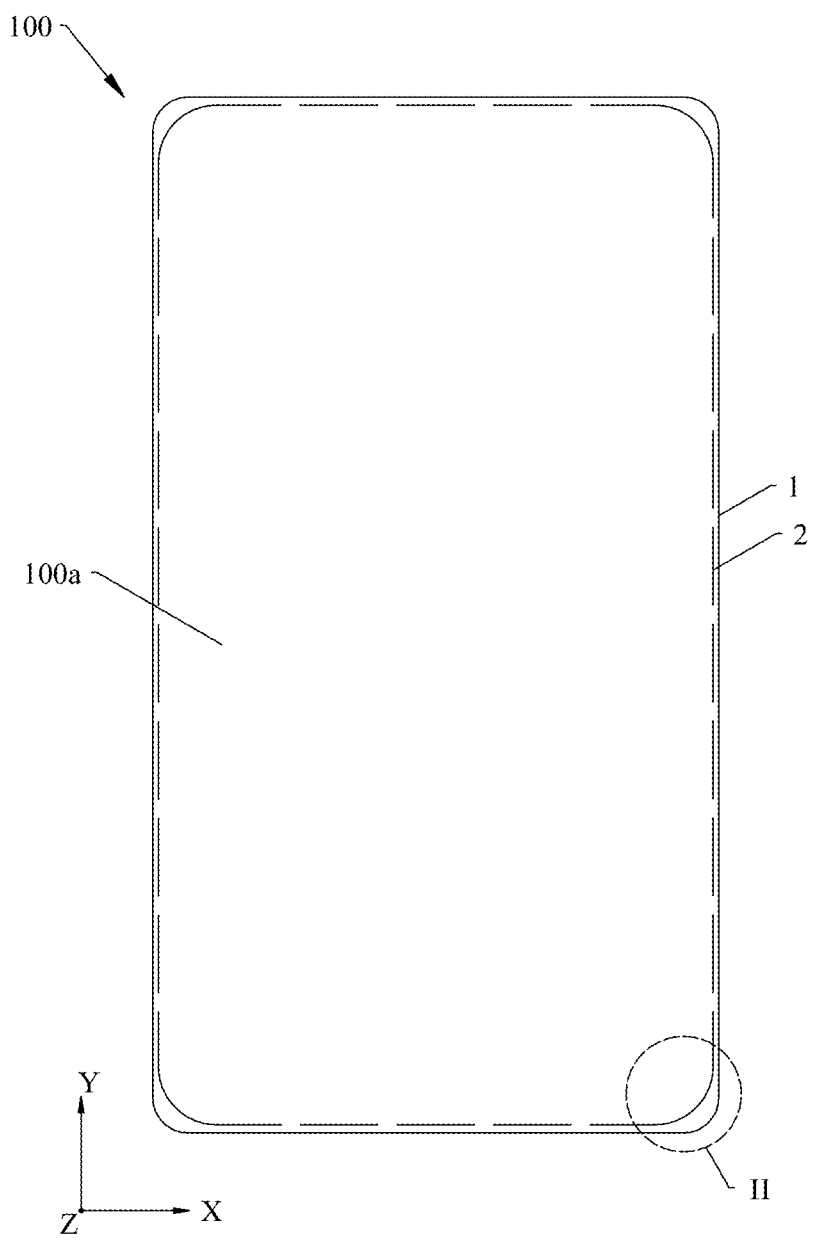
FIG. 6 is a main view of the electronic device shown in FIG. 3.
Figure 7:
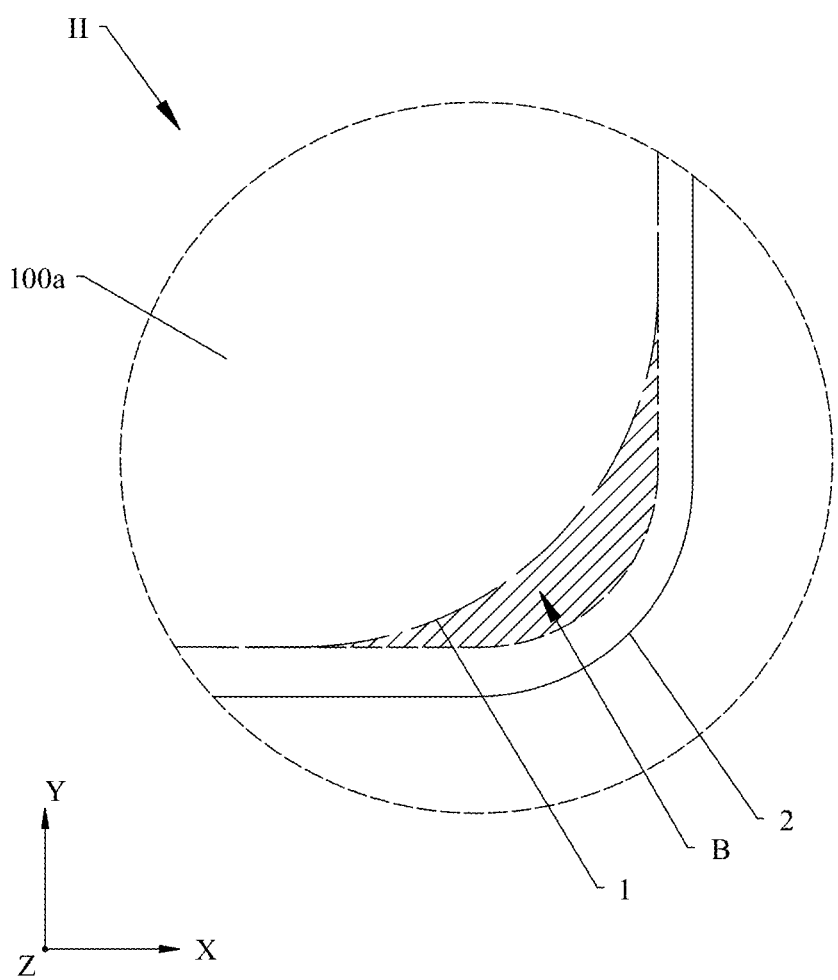
FIG. 7 is a locally enlarged view of region II of the electronic device shown in FIG. 6.

Refer to FIG. 4 to FIG. 7. FIG. 4 is a main view of the electronic device 100 shown in FIG. 1a. FIG. 5 is a local enlarged view of region I of the electronic device 100 shown in FIG. 4. FIG. 6 is a main view of the electronic device 100 shown in FIG. 3. FIG. 7 is a local enlarged view of region II of the electronic device 100 shown in FIG. 6. It can be seen from FIG. 4 to FIG. 7 that, in the electronic device 100, regardless of whether the light-transmitting cover plate 2 keeps the complete four-curved shape or has an unfilled corner formed at the edge corner, because an unfilled corner is formed at the edge corner of the flexible display panel 1, so that a large-area region (for example, an approximately-crescent-shaped region B) at the edge corner of the front face of the electronic device 100 cannot be used for display. As a result, the screen-to-body ratio of the electronic device cannot be further increased, leading to low information carrying efficiency of the display region.

Figure 8:
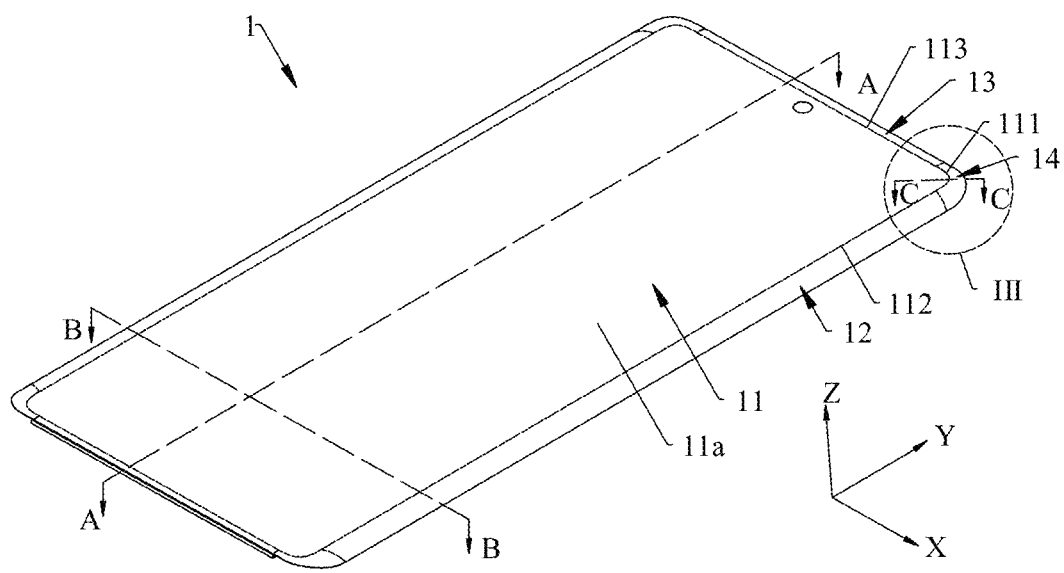
FIG. 8 is a three-dimensional diagram of a flexible display panel according to some embodiments of this application.
Figure 9:
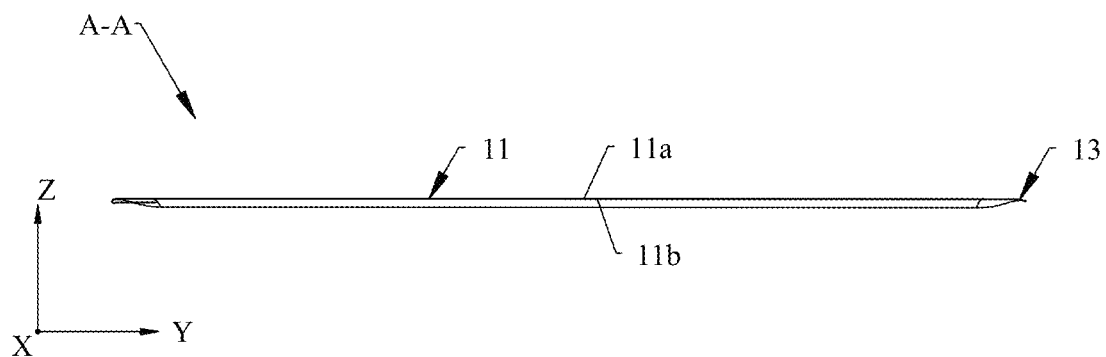
FIG. 9 is a cross-sectional view along line A-A of the flexible display panel shown in FIG. 8.
Figure 10:
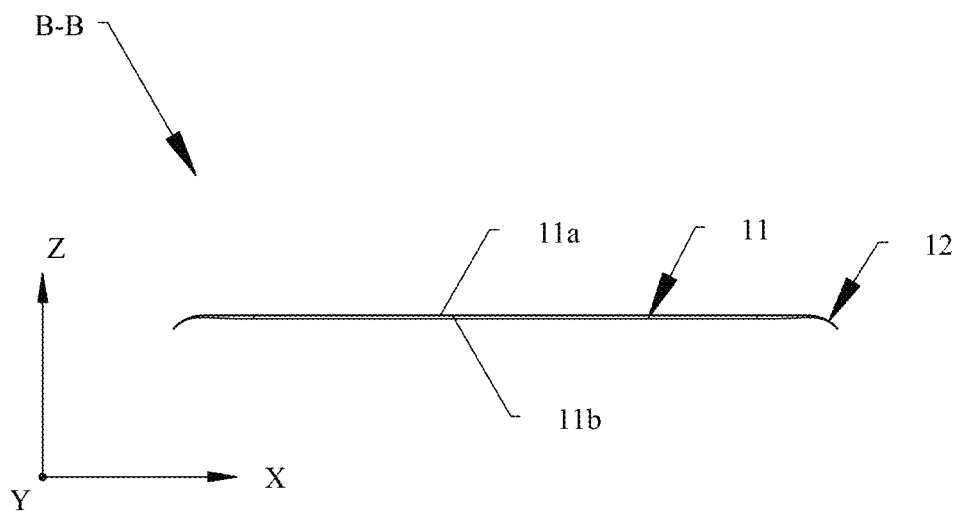
FIG. 10 is a cross-sectional view along line B-B of the flexible display panel shown in FIG. 8.
Figure 11:
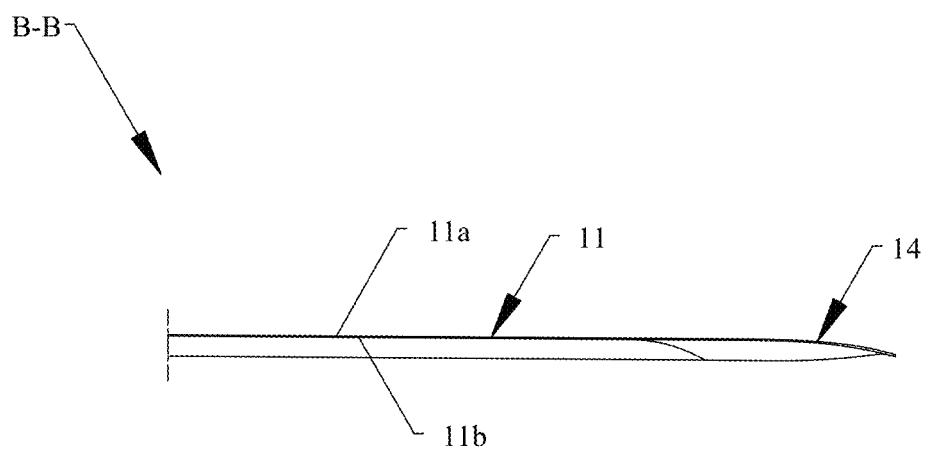
FIG. 11 is a cross-sectional view along line C-C of the flexible display panel shown in FIG. 8.

To resolve the foregoing problem, refer to FIG. 8 to FIG. 11. FIG. 8 is a three-dimensional diagram of a flexible display panel 1 according to some embodiments of this application. FIG. 9 is a cross-sectional view along line A-A of the flexible display panel 1 shown in FIG. 8. It should be noted that "line A-A" is a plane on which line A-A and arrows of two ends of the line A-A are located. The descriptions of similar accompanying drawings in the specification should be understood in the same way, and details are not described again below. FIG. 10 is a cross-sectional view along line B-B of the flexible display panel 1 shown in FIG. 8. FIG. 11 is a cross-sectional view along line C-C of the flexible display panel 1 shown in FIG. 8. The flexible display panel 1 shown in this embodiment differs from the flexible display panel 1 shown in FIG. 1 in that in this embodiment, the flexible display panel 1 further includes a third side view portion 14, in addition to the main view portion 11, the first side view portion 12, and the second side view portion 13.

The main view portion 11 is a main portion for a user to view the flexible display panel 1. Based on this, the main view portion 11 is located at the middle of the flexible display panel 1. Compared with the first side view portion 12, the second side view portion 13, and the third side view portion 14, the main view portion 11 has a larger area for the user to obtain images and information that are displayed on the flexible display panel 1.

The main view portion 11 is in a planar sheet shape, and the main view portion 11 is roughly rectangular in shape. Certainly, the main view portion 11 may alternatively be square, triangular, prismatic, polygonal, or of other shapes. In this embodiment of this application, an example in which the main view portion 11 is roughly rectangular in shape is used for description, which should not be considered as a special limitation on this application.

The main view portion 11 includes a display face 11a and a back face 11b. The display face 11a is a surface for the main view portion 11 to display images and information. The back face 11b is back to the display face 11a.

The first side view portion 12, the second side view portion 13, and the third side view portion 14 are secondary portions for the user to view the flexible display panel 1. The first side view portion 12, the second side view portion 13, and the third side view portion 14 are disposed at an edge of the main view portion 11. Specifically, the main view portion 11 is provided with a middle portion and an edge, where the edge of the main view portion 11 includes a first section 112, a second section 113, and a corner section 111.

In some embodiments, as shown in FIG. 8, the first section 112 extends in the Y-axis direction, the second section 113 extends in the X-axis direction, and the first section 112 and the second section 113 are two straight sections perpendicular to each other, meaning that an included angle between an extending line of the first section 112 and an extending line of the second section 113 is approximately equal to 90°. Certainly, when the main view portion 11 is triangular, prismatic, or polygonal in shape, the included angle between the extending line of the first section 112 and the extending line of the second section 113 may alternatively be less than 90° or greater than 90°. In this application, an example in which the included angle between the extending line of the first section 112 and the extending line of the second section 113 is approximately equal to 90° is used for description, which should not be considered as a special limitation on this application.

In some embodiments, as shown in FIG. 8, a length of the first section 112 may be greater than a length of the second section 113. In other words, the first section 112 is a long side of the main view portion 11, and the second section 113 is a short side of the main view portion 11. In some other embodiments, the length of the first section 112 may alternatively be less than or equal to the length of the second section 113. In this application, an example in which the length of the first section 112 is greater than the length of the second section 113 is used for description, which should not be considered as a special limitation on this application.

The corner section 111 is connected between the first section 112 and the second section 113. Optionally, the corner section 111 may be a transition arc connected between the first section 112 and the second section 113. In this way, the edge of the main view portion 11 has a smooth transition; and the first side view portion 12, the third side view portion 14, and the second side view portion 13 that are disposed at the edge of the main view portion 11 can transit smoothly in sequence, preventing damage to the flexible display panel 1 caused by an excessively large bent angle between the first side view portion 12 and the third side view portion 14, between the third side view portion 14 and the second side view portion 13, and inside the third side view portion 14.

The first side view portion 12, the second side view portion 13, and the third side view portion 14 are all bent relative to the main view portion 11 and are entirely in a curved surface shape with smooth transition. Specifically, as shown in FIG. 8 to FIG. 11, the first side view portion 12 extends from the first section 112 of the edge of the main view portion 11 in a direction leaving the middle portion of the main view portion 11 and bends toward a back face side of the main view portion 11. The back face side of the main view portion 11 is a side of the back face 11b of the main view portion 11 further away from the display face 11a. The first side view portion 12 bends toward the back face side, to be specific, normal directions of all parts of the first side view portion 12 gradually tilt toward the back face side of the main view portion 11 from an end closer to the main view portion 11 to an end further away from the main view portion 11. The second side view portion 13 extends from the second section 113 of the edge of the main view portion 11 in a direction leaving the middle portion of the main view portion 11 and bends toward the back face side of the main view portion 11. The third side view portion 14 is connected between the first side view portion 12 and the second side view portion 13, and the third side view portion 14 extends from the corner section 111 of the edge of the main view portion 11 in a direction leaving the middle portion of the main view portion 11 and bends toward the back face side of the main view portion 11.

In this way, the flexible display panel 1 is not only provided with a curved shape on the side, the top, or the bottom, but also provided with a curved shape at an edge corner. When such flexible display panel 1 is applied to the electronic device 100, it is unnecessary to form an upwarp corner on a middle frame 20, thereby reducing processing difficulty of the middle frame 20. In addition, the flexible display panel 1 is not only disposed in the curved shape on the side, the top, or the bottom of a light-transmitting cover plate 2, but also disposed in a curved shape at an edge corner of the light-transmitting cover plate 2. Therefore, a black edge width of a corner of a front face of the electronic device 100 is consistent with a black edge width of the side, the top, or the bottom, ensuring that the front face of the electronic device 100 looks good. In addition, the screen-to-body ratio of the electronic device 100 can be further increased, improving information carrying efficiency of the display region and enhancing product competitiveness.

Figure 12:
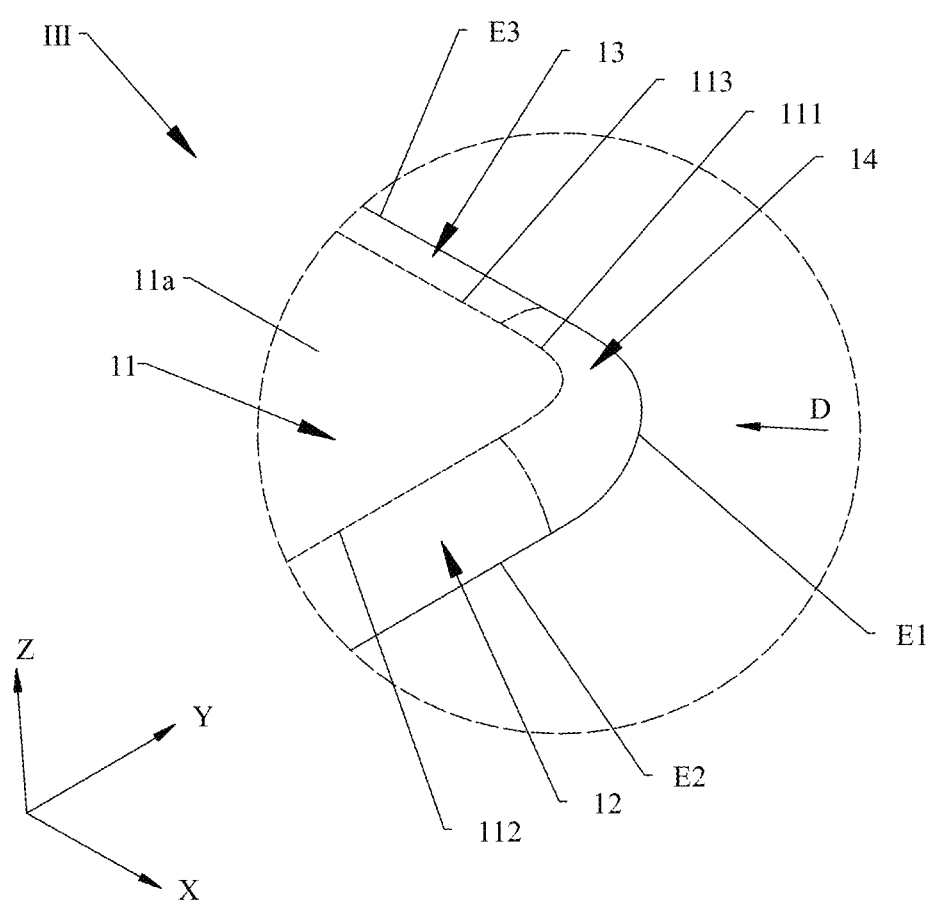
FIG. 12 is a locally enlarged view of region III of the flexible display panel shown in FIG. 8.
Figure 13:
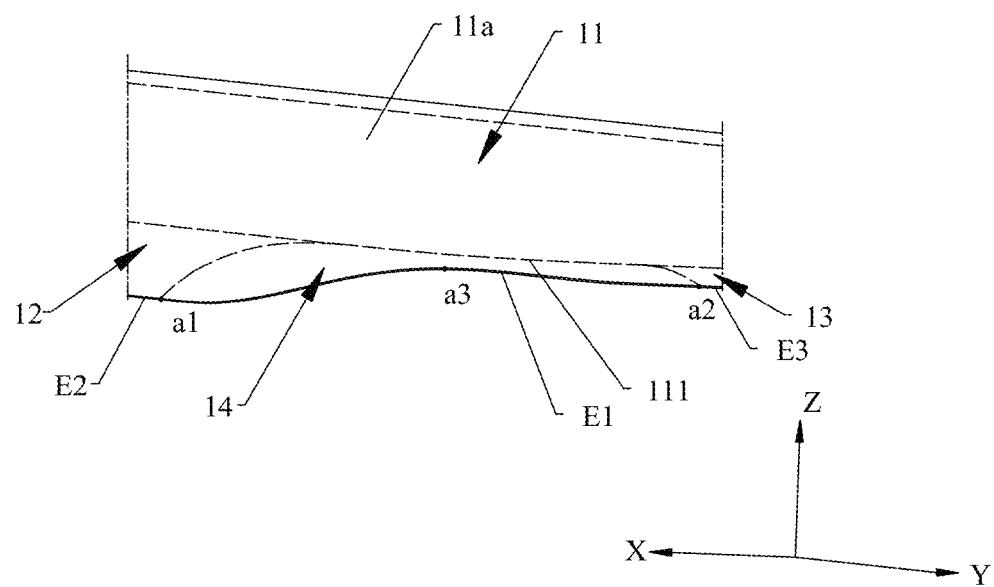
FIG. 13 is a schematic structural diagram of the flexible display panel shown in FIG. 12 when viewed from direction D.

Based on the foregoing embodiment, to prevent the flexible display panel 1 from generating wrinkles, in some embodiments, refer to FIG. 12 and FIG. 13. FIG. 12 is a local enlarged view of region III of the flexible display panel 1 shown in FIG. 8. FIG. 13 is a schematic structural diagram of the flexible display panel 1 shown in FIG. 12 when viewed from direction D. An edge of the first side view portion 12 further away from the main view portion 11 is an outer contour of the first side view portion 12, denoted as E2 in FIG. 12 and FIG. 13. An edge of the second side view portion 13 further away from the main view portion 11 is an outer contour of the second side view portion 13, denoted as E3 in FIG. 12 and FIG. 13. An edge of the third side view portion 14 further away from the main view portion 11 is an outer contour of the third side view portion 14, denoted as E1 in FIG. 12 and FIG. 13. Two ends of the outer contour E1 of the third side view portion 14 respectively connect to the outer contour E2 of the first side view portion 12 and the outer contour E3 of the second side view portion 13. A middle portion of the outer contour E1 of the third side view portion 14 upwarps toward the main view portion 11 in a direction perpendicular to the main view portion 11.

Specifically, as shown in FIG. 13, one end of the outer contour E1 of the third side view portion 14 connects to the outer contour E2 of the first side view portion 12, with an intersection of a1. The other end of the outer contour E1 of the third side view portion 14 connects to the outer contour E3 of the second side view portion 13, with an intersection of a2. The part of the outer contour E1 that upwarps toward the main view portion 11 has an apex a3. The middle portion of the outer contour E1 of the third side view portion 14 upwarps toward the main view portion 11 in a direction perpendicular to the main view portion 11 (that is, the Z-axis direction). To be specific, at least a perpendicular distance from the apex a3 of the outer contour E1 to the display face 11a of the main view portion 11 is greater than a perpendicular distance from the intersection a1 to the display face 11a of the main view portion 11; and the perpendicular distance from the apex a3 to the display face 11a of the main view portion 11 is also greater than a perpendicular distance from the intersection a2 to the display face 11a of the main view portion 11.

In this way, a part located between an upwarp part in the middle portion of the outer contour E1 of the third side view portion 14 and the corner section 111 forms a redundant part of the edge corner of the flexible display panel 1. The redundant part is in an unfolded state without generating any wrinkle. When such flexible display panel 1 is applied to an electronic device, a display effect of the electronic device is not affected.

In some embodiments, as shown in FIG. 13, smooth transition is present between the outer contour E1 and the outer contour E2, between the outer contour E1 and the outer contour E3, and between all parts in the outer contour E1. It is known that when a user takes up an electronic device such as a mobile phone, a front face of the electronic device is a region that the user mainly looks at. An entire contour of the front face of the electronic device is mainly affected by a contour of an inner display panel. Correspondingly, a middle frame is constructed based on a shape of a display. In addition, this is especially true for a common electronic device that seeks for a higher screen-to-body ratio (such as a narrow-frame design or an all-screen design). For this reason, the flexible display panel 1 in the embodiments of this application implements smooth transition between the outer contour E1 and the outer contour E2, between the outer contour E1 and the outer contour E3, and between all parts in the outer contour E1. Therefore, when such flexible display panel 1 is applied to the electronic device 100, regions of the front face of the electronic device 100 at the corners have no notch or depression with unnatural transition, better meeting use habits of users.

Figure 14:
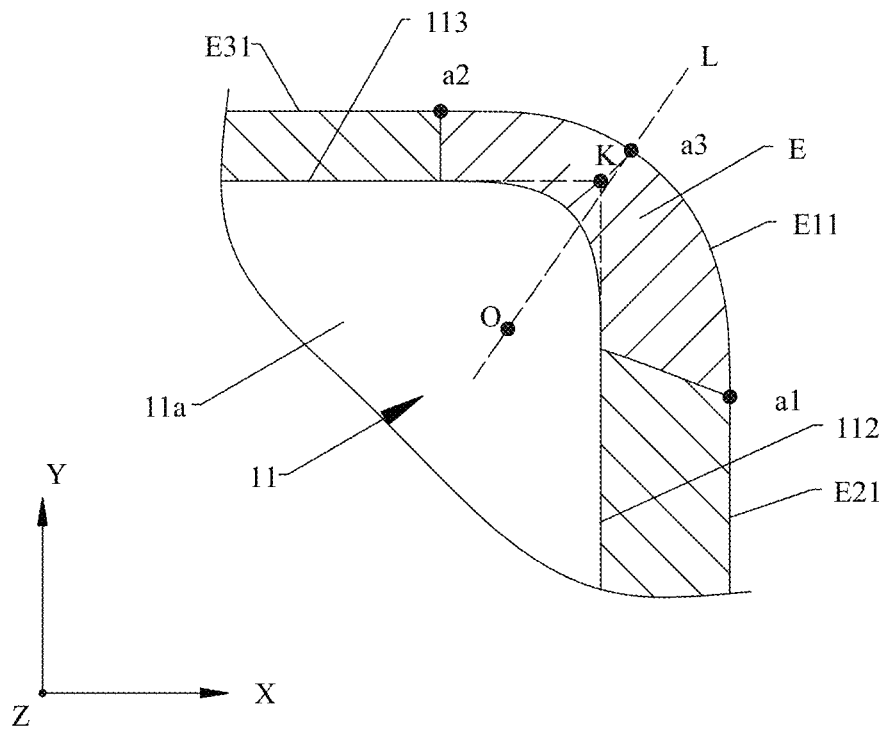
FIG. 14 is a schematic diagram of orthographic projections of a first side view portion, a second side view portion, and a third side view portion of the flexible display panel shown in FIG. 13 on a display face of a main view portion.

In some embodiments, refer to FIG. 14. FIG. 14 is a schematic diagram of orthographic projections of the first side view portion 12, the second side view portion 13, and the third side view portion 14 of the flexible display panel 1 shown in FIG. 13 on the display face 11a of the main view portion 11. The orthographic projection of the outer contour E2 of the first side view portion 12 on the display face 11a of the main view portion 11 is a first projection E21. The orthographic projection of the outer contour E3 of the second side view portion 13 on the display face 11a of the main view portion 11 is a second projection E31. The orthographic projection of the outer contour E1 of the third side view portion 14 on the display face 11a of the main view portion 11 is a third projection E11. The third projection E11 is a transition arc connected between the first projection E21 and the second projection E31, and the center of the transition arc is O. In this way, when such flexible display panel 1 is applied to an electronic device such as a mobile phone, edge corners of a front face of the electronic device are in a round corner shape, ensuring aesthetics and better meeting use habits of users.

In some embodiments, as shown in FIG. 14, the orthographic projection of the third side view portion 14 on the display face 11a of the main view portion 11 is a fourth projection E. An intersection K of an extending line of the first section 112 and an extending line of the second section 113 is located within the fourth projection E. In this way, the third side view portion 14 has a larger area, and therefore has a larger orthographic projection on the display face 11a, which can increase the screen-to-body ratio of the electronic device 100.

Figure 15:
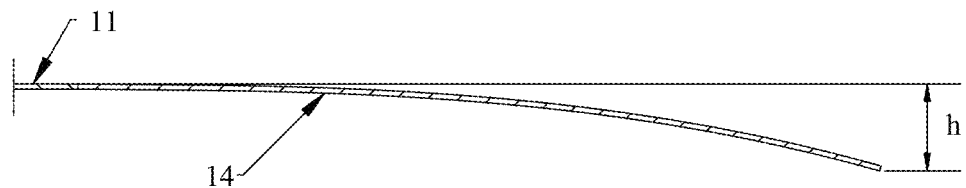
FIG. 15 is a cross-sectional view at section L of the flexible display panel shown in FIG. 14.

In some embodiments, refer to FIG. 15. FIG. 15 is a cross-sectional view at section L of the flexible display panel 1 shown in FIG. 14. The section L is a plane that passes through the apex a3 of the outer contour E1 and the center O of the third projection E11 and that is perpendicular to the main view portion 11. A height of the third side view portion 14 in a direction perpendicular to the main view portion 11 (that is, the Z-axis direction) is h, where h is greater than 0 millimeters (mm). Specifically, h is greater than or equal to 0.05 mm and less than or equal to 0.25 mm. In this way, the flexible display panel 1 has a moderate redundancy on the third side view portion 14, preventing the flexible display panel 1 from generating wrinkles as far as possible while maintaining the curved shape of the flexible display panel 1.

Figure 16:
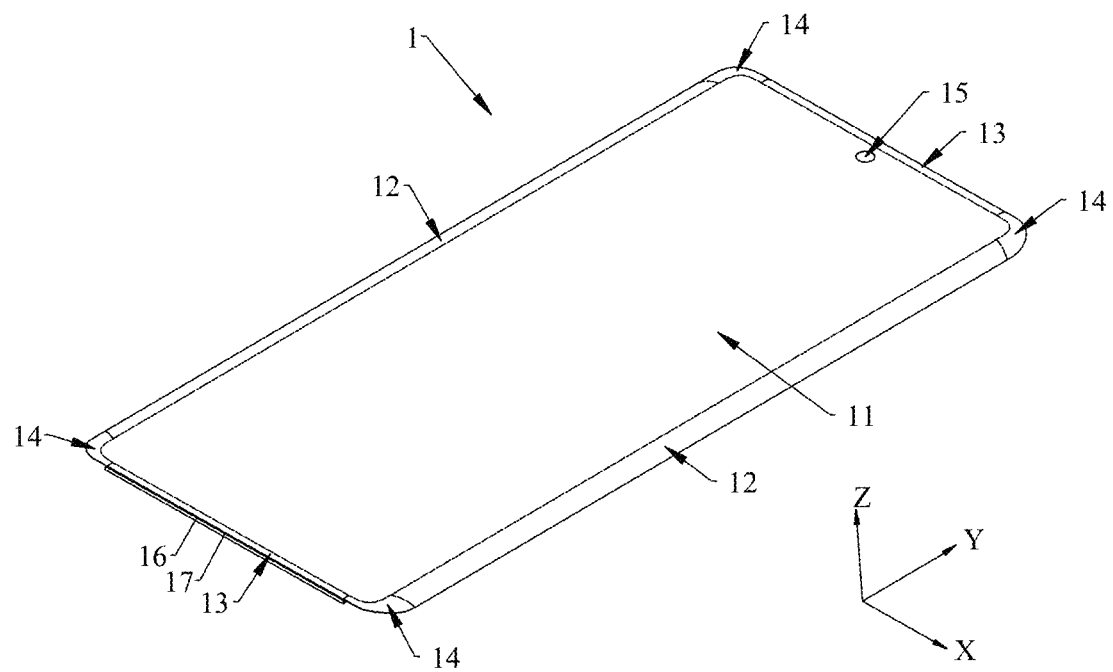
FIG. 16 is a schematic structural diagram of the flexible display shown in FIG. 8.

In some embodiments, refer to FIG. 16. FIG. 16 is a schematic structural diagram of the flexible display 1 shown in FIG. 8. In this embodiment, two first side view portions 12 and two second side view portions 13 are provided. The two first side view portions 12 are respectively disposed on two opposite sides of the main view portion 11. The two second side view portions 13 are respectively disposed on another two opposite sides of the main view portion 11. Four third side view portions 14 are provided. The four third side view portions 14 are respectively disposed on four corner sections of the edge of the main view portion 11, with each being connected between the corresponding adjacent first side view portion 12 and second side view portion 13. In this way, the flexible display panel 1 is in a four-curved shape and can match a four-curved light-transmitting cover plate to form a four-curved screen, so that an electronic device with such four-curved screen can be formed, thereby improving a screen-to-body ratio and product competitiveness of the electronic device.

In some embodiments, as shown in FIG. 16, the flexible display panel 1 is also provided with a camera hole 15. When such flexible display panel 1 is applied to an electronic device such as a mobile phone, the camera hole 15 is opposite a camera of the electronic device, so that external ambient light can pass through the camera hole 15 to enter the camera, implementing picture or video shooting.

In some embodiments, as shown in FIG. 16, the flexible display panel 1 is also provided with a circuit connecting terminal 16 at an outer edge of the second side view portion 13. The circuit connecting terminal 16 is configured to be electrically connected to a flexible printed circuit board (flexible printed circuit. FPC) 17, to transmit images and information to the flexible display panel 1 through the FPC 17. In some other embodiments, the circuit connecting terminal 16 may alternatively be disposed at an outer edge of the first side view portion 12 or an outer edge of the third side view portion 14.

This application further provides a display. The display is a display including the flexible display panel 1 provided in any one of the foregoing embodiments.

Figure 17:
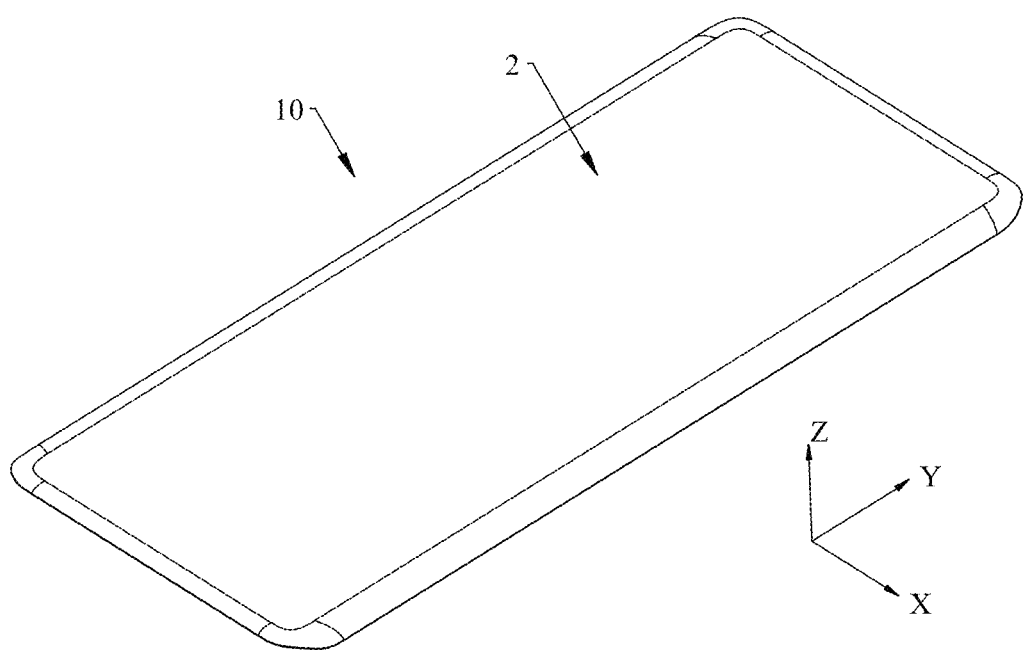
FIG. 17 is a schematic structural diagram of a display according to some embodiments of this application.
Figure 18:
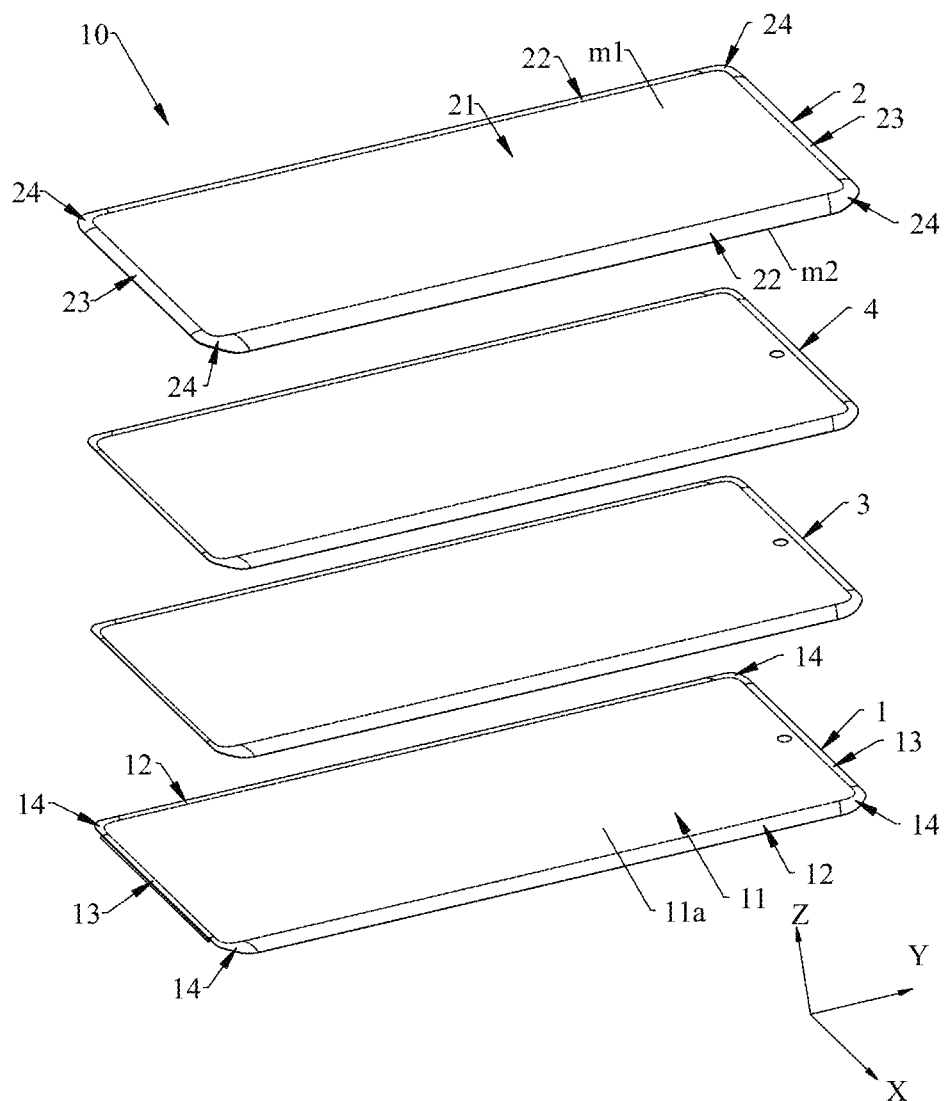
FIG. 18 is an exploded view of the display shown in FIG. 17.
Figure 19:
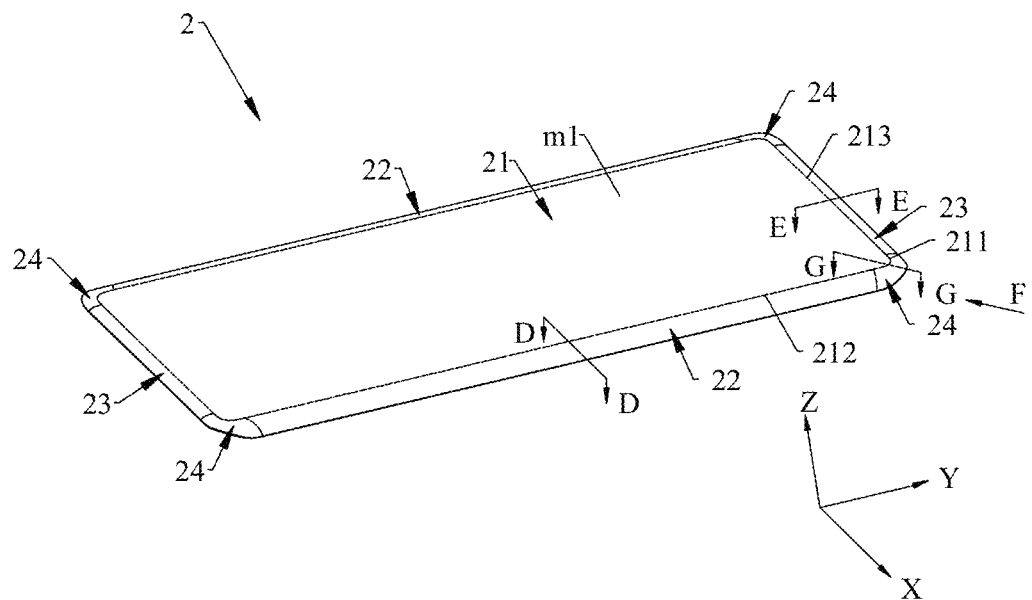
FIG. 19 is a schematic structural diagram of an outer surface of a light-transmitting cover plate of the display shown in FIG. 17 and FIG. 18.
Figure 20:
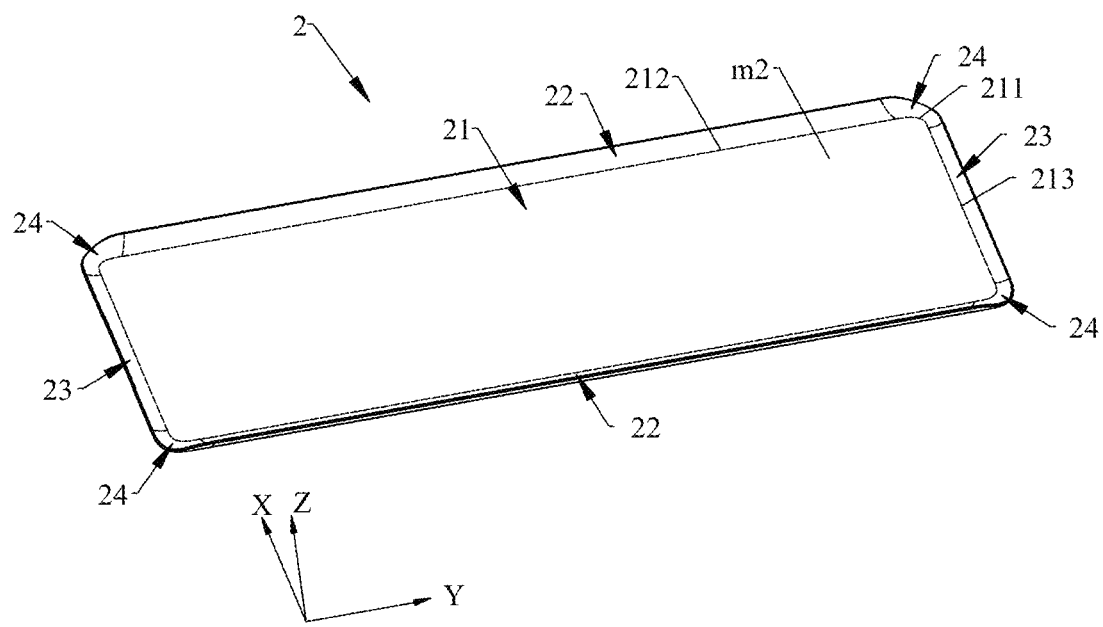
FIG. 20 is a schematic structural diagram of an inner surface of the light-transmitting cover plate of the display shown in FIG. 17 and FIG. 18.

For example, refer to FIG. 17 and FIG. 18. FIG. 17 is a schematic structural diagram of a display 10 according to some embodiments of this application. FIG. 18 is an exploded view of the display 10 shown in FIG. 17. In addition to the flexible display panel 1, the display 10 further includes a light-transmitting cover plate 2. A material of the light-transmitting cover plate 2 includes but is not limited to glass and plastic. The light-transmitting cover plate 2 has an outer surface m1 and an inner surface m2 that is back to the outer surface m1. Refer to FIG. 19 and FIG. 20. FIG. 19 is a schematic structural diagram of the outer surface m1 of the light-transmitting cover plate 2 of the display 10 shown in FIG. 17 and FIG. 18. FIG. 20 is a schematic structural diagram of the inner surface m2 of the light-transmitting cover plate 2 of the display 10 shown in FIG. 17 and FIG. 18. When the light-transmitting cover plate 2 is applied to an electronic device, the outer surface m1 of the light-transmitting cover plate 2 faces toward the outside of the electronic device, and the inner surface m2 of the light-transmitting cover plate 2 faces toward the inside of the electronic device. The flexible display panel 1 is disposed on an inner side of the light-transmitting cover plate 2 through stacking. The light-transmitting cover plate 2 is configured to protect the flexible display panel 1.

As shown in FIG. 19 and FIG. 20, the light-transmitting cover plate 2 includes a flat plate portion 21, and a first arc sheet portion 22, a second arc sheet portion 23, and a third arc sheet portion 24 that are disposed at an edge of the flat plate portion 21.

In some embodiments, the flat plate portion 21 is roughly rectangular in shape. In some other embodiments, the flat plate portion 21 may alternatively be square, triangular, prismatic, polygonal, or of other shapes. In this embodiment of this application, an example in which the flat plate portion 21 is roughly rectangular in shape is used for description, which should not be considered as a special limitation on this application.

The flat plate portion 21 includes a middle portion and an edge, where the edge of the flat plate portion 21 includes a first edge 212, a second edge 213, and a corner edge 211.

The first arc sheet portion 22, the second arc sheet portion 23, and the third arc sheet portion 24 each bend relative to the flat plate portion 21 and are entirely in an arc sheet shape with smooth transition.

Specifically, as shown in FIG. 19 and FIG. 20, the first arc sheet portion 22 extends from the first edge 212 of the flat plate portion 21 in a direction leaving the middle portion of the flat plate portion 21 and bends toward an inner side of the flat plate portion 21. The second arc sheet portion 23 extends from the second edge 213 of the flat plate portion 21 in a direction leaving the middle portion of the flat plate portion 21 and bends toward the inner side of the flat plate portion 21. The third arc sheet portion 24 is connected between the first arc sheet portion 22 and the second arc sheet portion 23, and the third arc sheet portion 24 extends from the corner edge 211 of the flat plate portion 21 in a direction leaving the middle portion of the flat plate portion 21 and bends toward the inner side of the flat plate portion 21.

In this way, the light-transmitting cover plate 2 is not only provided with an arc shape on the side, the top, or the bottom of an inner surface 22, but also provided with an arc shape at an edge corner to fit the flexible display panel 1.

Specifically: as shown in FIG. 18, the main view portion 11 of the flexible display panel 1 and the flat plate portion 21 of the light-transmitting cover plate 2 are stacked, the display face 11a of the main view portion 11 faces toward the flat plate portion 21, and the flat plate portion 21 fits the main view portion 11. The first side view portion 12 of the flexible display panel 1 and the first arc sheet portion 22 of the light-transmitting cover plate 2 are stacked, and the first arc sheet portion 22 fits the first side view portion 12. The second side view portion 13 of the flexible display panel 1 and the second arc sheet portion 23 of the light-transmitting cover plate 2 are stacked, and the second arc sheet portion 23 fits the second side view portion 13. The third side view portion 14 of the flexible display panel 1 and the third arc sheet portion 24 of the light-transmitting cover plate 2 are stacked, and the third arc sheet portion 24 fits the third side view portion 14. In this way, the light-transmitting cover plate 2 fits the flexible display panel 1. The flexible display panel 1 can be attached to the inner surface 22 of the light-transmitting cover plate 2 to form curved shapes on two sides, the top, or the bottom of the flexible display panel 1.

Figure 21:
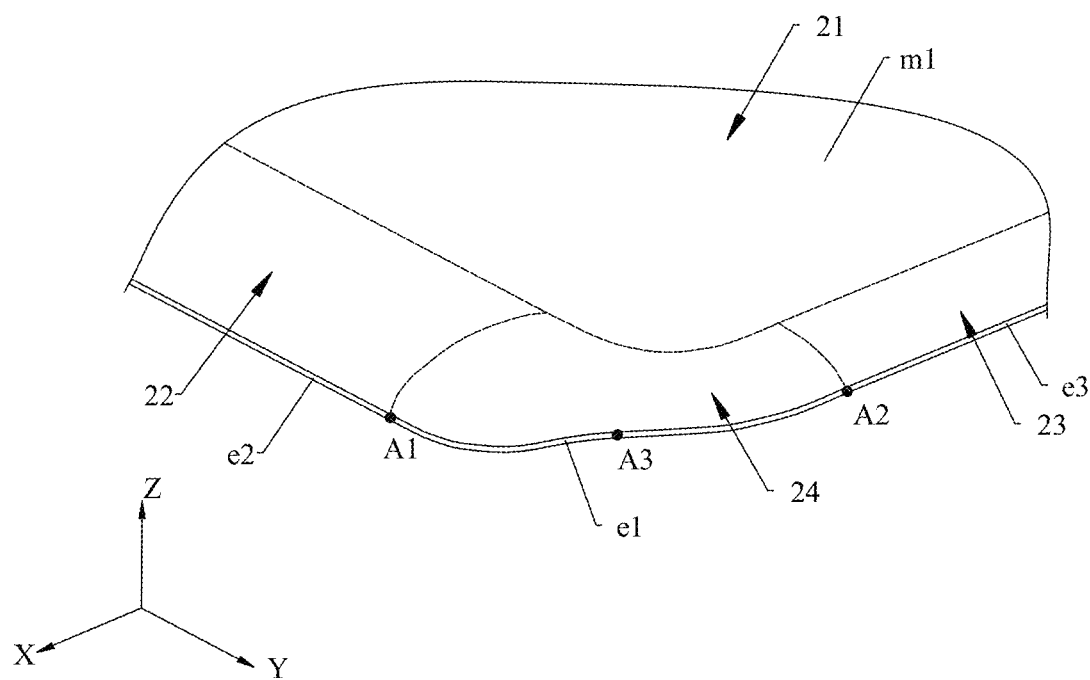
FIG. 21 is a schematic structural diagram of the light-transmitting cover plate shown in FIG. 19 when viewed from direction F.

Based on the foregoing embodiment, the third arc sheet portion 24 needs to be more adapted to the third side view portion 14 of the flexible display panel 1. For this, in some embodiments, refer to FIG. 21. FIG. 21 is a schematic structural diagram of the light-transmitting cover plate 2 shown in FIG. 19 when viewed from direction F. An edge of the first arc sheet portion 22 further away from the flat plate portion 21 is an outer contour of the first arc sheet portion 22, denoted as e2 in FIG. 21. An edge of the second arc sheet portion 23 further away from the flat plate portion 21 is an outer contour of the second arc sheet portion 23, denoted as e3 in FIG. 21. An edge of the third arc sheet portion 24 further away from the flat plate portion 21 is an outer contour of the third arc sheet portion 24, denoted as e1 in FIG. 21. Two ends of the outer contour e1 of the third arc sheet portion 24 respectively connect to the outer contour e2 of the first arc sheet portion 22 and the outer contour e3 of the second arc sheet portion 23. A middle portion of the outer contour e1 of the third arc sheet portion 24 upwarps toward the flat plate portion 21 in a direction perpendicular to the flat plate portion 21.

Specifically, as shown in FIG. 21, one end of the outer contour e1 of the third arc sheet portion 24 connects to the outer contour e2 of the first arc sheet portion 22, with an intersection of A1. The other end of the outer contour e1 of the third arc sheet portion 24 connects to the outer contour e3 of the second arc sheet portion 23, with an intersection of A2. The part of the outer contour e1 that upwarps toward the flat plate portion 21 has an apex A3. The middle portion of the outer contour e1 of the third arc sheet portion 24 upwarps toward the flat plate portion 21 in the direction perpendicular to the flat plate portion 21. To be specific, at least a perpendicular distance from the apex A3 of the outer contour e1 to an outer surface of the flat plate portion 21 is greater than a perpendicular distance from the intersection A1 to the outer surface of the flat plate portion 21; and the perpendicular distance from the apex A3 to the outer surface of the flat plate portion 21 is also greater than a perpendicular distance from the intersection A2 to the outer surface of the flat plate portion 21.

In this way, the third arc sheet portion 24 fits the third side view portion 14, ensuring that they can be fitted together. In some other embodiments, the outer contour e1 may alternatively have no upwarp part. In this way, the third arc sheet portion 24 does not fit the third side view portion 14, and distances from all parts in the third arc sheet portion 24 to the third side view portion 14 are unequal. On this basis, a gap between the third arc sheet portion 24 and the third side view portion 14 may be filled through a liquid light-transmitting adhesive (such as an OCA adhesive) with an unfixed shape. The liquid light-transmitting adhesive has fluidity and can flow from a region with a small gap to a region with a large gap to keep respective shapes of the third arc sheet portion 24 and the third side view portion 14.

In some embodiments, smooth transition is present between the outer contour e1 and the outer contour e2, between the outer contour e1 and the outer contour e3, and between all parts in the outer contour e1. In this way, smooth transition at an edge of the light-transmitting cover plate 2 prevents generation of unnatural notches or depressions, better meeting use habits of users.

In some embodiments, an orthographic projection of the outer contour e2 on the outer surface of the flat plate portion 21 is a fifth projection; an orthographic projection of the outer contour e3 on the outer surface of the flat plate portion 21 is a sixth projection; and an orthographic projection of the outer contour e1 on the outer surface of the flat plate portion 21 is a seventh projection. The seventh projection is a transition arc connected between the fifth projection and the sixth projection. In this way, when the light-transmitting cover plate 2 is applied to an electronic device, edge corners of the light-transmitting cover plate 2 are in a round corner shape on a front face of the electronic device, ensuring aesthetics and better meeting use habits of users.

In some embodiments, an orthographic projection of the third arc sheet portion 24 on the outer surface of the flat plate portion 21 is an eighth projection, and an intersection of an extending line of the first edge 212 and an extending line of the second edge 213 is located within the eight projection. In this way, the third arc sheet portion 24 has a relatively large area and can cover the third side view portion 14 to effectively protect the third side view portion 14.

In some embodiments, as shown in FIG. 20, two first arc sheet portions 22 and two second arc sheet portions 23 are provided. The two first arc sheet portions 22 are respectively disposed on two opposite sides of the flat plate portion 21. The two second arc sheet portions 23 are respectively disposed on another two opposite sides of the flat plate portion 21. Two first side view portions 12 of the flexible display panel 1 are respectively stacked with the two first arc sheet portions 22, and the two first arc sheet portions 22 respectively fit the two first side view portions 12 of the flexible display panel 1. Two second side view portions 13 of the flexible display panel 1 are respectively stacked with the two second arc sheet portions 23, and the two arc sheet portions 23 respectively fit the two second side view portions 13 of the flexible display panel 1. Four third arc sheet portions 24 are provided. The four third arc sheet portions 24 are respectively disposed at four corner edges of the edge of the flat plate portion 21, with each being connected between the corresponding adjacent first arc sheet portion 22 and second arc sheet portion 23. Four third side view portions 14 of the flexible display panel 1 are respectively stacked with the four third arc sheet portions 24, and the four third arc sheet portions 24 respectively fit the four third side view portions 14 of the flexible display panel 1. In this way, the light-transmitting cover plate 2 can cover the two first side view portions 12, the two second side view portions 13, and the four third side view portions 14 of the flexible display 1 to effectively protect the flexible display 1.

Figure 22:
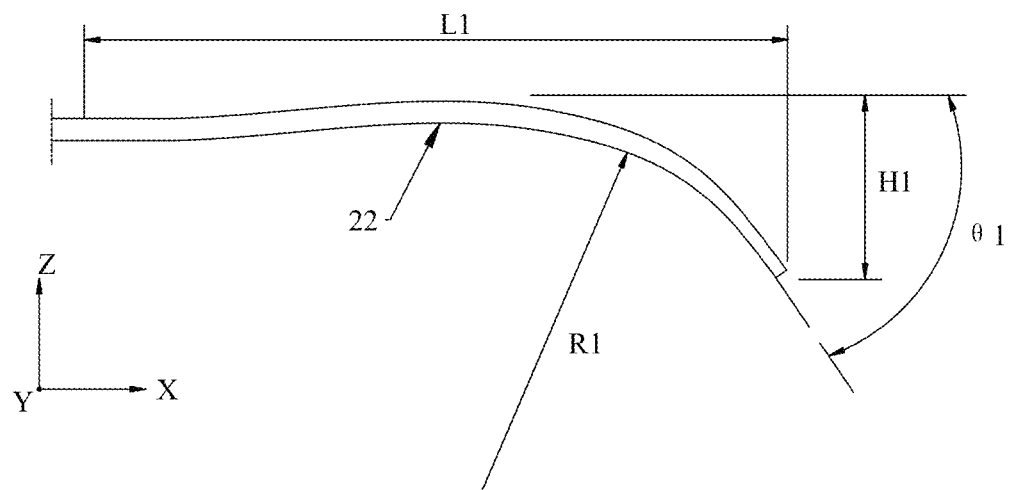
FIG. 22 is a cross-sectional view along line D-D of the light-transmitting cover plate shown in FIG. 19.

In some embodiments, refer to FIG. 22. FIG. 22 is a cross-sectional view along line D-D of the light-transmitting cover plate 2 shown in FIG. 19. The first arc sheet portion 22 has a decreasing thickness from one end connecting to the flat plate portion 21 to the outer contour of the first arc sheet portion 22. It should be noted that a thickness of each part of an arc sheet portion (such as the first arc sheet portion 22) described in this embodiment and the following embodiments is a distance from an inner surface of that part of the arc sheet portion to an outer surface along a normal direction of the inner surface. In this way, on a basis that an inner surface of the first arc sheet portion 22 fits the first side view portion 12 of the flexible display panel 1, an outer surface of the first arc sheet portion 22 has a larger radian, allowing a user to enjoy pictures with a more-3D effect.

In the foregoing embodiment, it should be noted that the inner surface of the first arc sheet portion 22 is a surface of the first arc sheet portion 22 facing toward the inside of an electronic device when the light-transmitting cover plate 2 is applied to the electronic device. Correspondingly, the outer surface of the first arc sheet portion 22 is a surface of the first arc sheet portion 22 facing toward the outside of an electronic device when the light-transmitting cover plate 2 is applied to the electronic device.

In some embodiments, a processing procedure of the first arc sheet portion 22 described in the foregoing embodiments may be as follows: First, an edge portion of a planar light-transmitting cover plate is bent through hot pressing to form an equally thick arc sheet portion; and then part of a material of an outer surface of the equally thick arc sheet portion is removed through a computerised numerical control machine (computerised numerical control machine, CNC) to form the first arc sheet portion 22 with a decreasing thickness. This forming procedure is simple and cost-efficient.

In some embodiments, as shown in FIG. 22, a length L1 of the first arc sheet portion 22 in a direction parallel to the flat plate portion 21 and perpendicular to the first edge 212 of the flat plate portion 21 is less than or equal to 6 mm. Optionally, L1 may be 2 mm, 2.5 mm, 3 mm, 3.5 mm, 4 mm, 4.5 mm, 5 mm, 5.5 mm, 6 mm, or the like. In this way, when the light-transmitting cover plate 2 is applied to an electronic device, the first arc sheet portion 22 occupies a small area on a front face of the electronic device. With a given display region, an area of the flat plate portion 21 can be set larger, so that a user can view more images or information displayed on the flexible display panel 1 from the flat plate portion 21, thereby reducing visual errors.

In some embodiments, as shown in FIG. 22, a height H1 of the first arc sheet portion 22 in a direction perpendicular to the flat plate portion 21 is less than or equal to 3.5 mm. Optionally, H1 may be 1 mm, 1.5 mm, 2 mm, 2.5 mm, 3 mm, 3.5 mm, or the like. As the height H1 of the first arc sheet portion 22 affects height of the light-transmitting cover plate 2, when the light-transmitting cover plate 2 is applied to an electronic device, the height of the light-transmitting cover plate 2 affects thickness of the electronic device. Therefore, when the height H1 of the first arc sheet portion 22 is less than or equal to 3.5 mm, such a small height H1 allows the electronic device to be thinner.

In some embodiments, as shown in FIG. 22, an edge of the inner surface of the first arc sheet portion 22 further away from the inner surface of the flat plate portion 21 is an outer edge of the inner surface of the first arc sheet portion 22. An included angle θ1 between a tangent plane at the outer edge of the inner surface of the first arc sheet portion 22 and the outer surface of the flat plate portion 21 is less than or equal to 89°. Optionally, the included angle θ1 may be 50°, 55°, 60°, 65°, 70°, 75°, 80°, 85°, 89°, or the like. In this way, a user can enjoy pictures with a more-3D effect.

In some embodiments, as shown in FIG. 22, a curvature radius R1 of the inner surface of the first arc sheet portion 22 is greater than or equal to 2.5 mm. Optionally, the curvature radius R1 may be 2.5 mm, 3 mm, 3.5 mm, 4 mm, or the like. In this way, the curvature radius R1 of the inner surface of the first arc sheet portion 22 is large, so that a bent angle is small in the case of bending a planar light-transmitting cover plate through hot pressing to form the first arc sheet portion 22, guaranteeing forming yield of the first arc sheet portion 22. Curvature radii R1 of all parts of the inner surface of the first arc sheet portion 22 may be the same or different, which is not specifically limited in this embodiment of this application.

Figure 23:
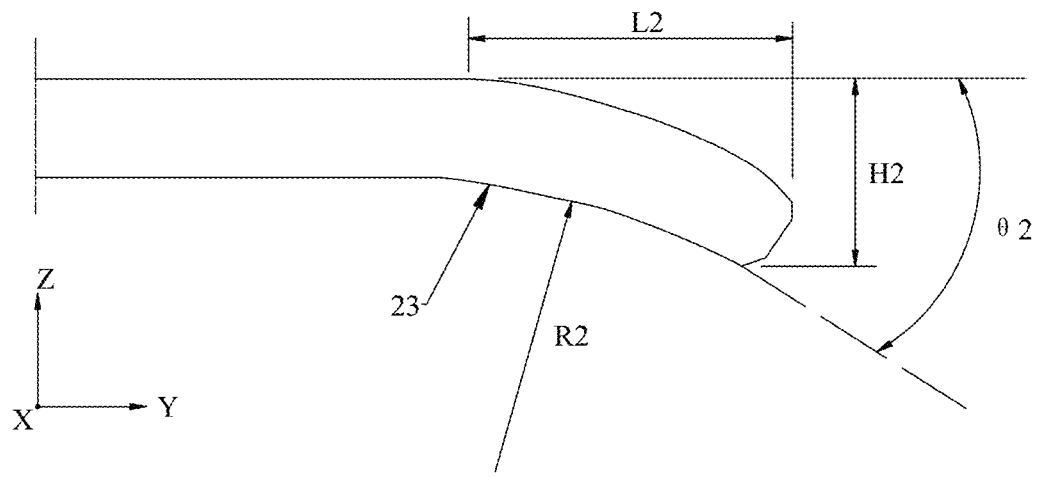
FIG. 23 is a cross-sectional view along line E-E of the light-transmitting cover plate shown in FIG. 19.

In some embodiments, refer to FIG. 23. FIG. 23 is a cross-sectional view along line E-E of the light-transmitting cover plate 2 shown in FIG. 19. The second arc sheet portion 23 has a decreasing thickness from one end connecting to the flat plate portion 21 to the outer contour of the second arc sheet portion 23. In this way: on a basis that an inner surface of the second arc sheet portion 23 fits the second side view portion 13 of the flexible display panel 1, an outer surface of the second arc sheet portion 23 has a larger radian, allowing a user to view a more-3D picture.

In the foregoing embodiment, it should be noted that the inner surface of the second arc sheet portion 23 is a surface of the second arc sheet portion 23 facing toward the inside of an electronic device when the light-transmitting cover plate 2 is applied to the electronic device. Correspondingly, the outer surface of the second arc sheet portion 23 is a surface of the second arc sheet portion 23 facing toward the outside of an electronic device when the light-transmitting cover plate 2 is applied to the electronic device.

In some embodiments, the second arc sheet portion 23 may alternatively be formed through a combination of hot pressing and CNC, so as to reduce forming difficulty and processing cost of the second arc sheet portion 23.

In some embodiments, as shown in FIG. 23, a length L2 of the second arc sheet portion 23 in a direction parallel to the flat plate portion 21 and perpendicular to the second edge 213 of the flat plate portion 21 is less than or equal to 6 mm. Optionally. L2 may be 1 mm. 1.5 mm. 2 mm. 2.5 mm. 3 mm. 3.5 mm. 4 mm, or the like. In this way, when the light-transmitting cover plate 2 is applied to an electronic device, the second arc sheet portion 23 occupies a small area on a front face of the electronic device. With a given display region, an area of the flat plate portion can be set larger, so that a user can view more information or images displayed on the flexible display panel 1 from the flat plate portion, thereby reducing visual errors.

In some embodiments, as shown in FIG. 23, a height H2 of the second arc sheet portion 23 in the direction perpendicular to the flat plate portion 21 is less than or equal to 1.5 mm. Optionally, H2 may be 0.5 mm, 0.8 mm, 1 mm, 1.1 mm, 1.2 mm, 1.3 mm, 1.4 mm, 1.5 mm, or the like. When the light-transmitting cover plate 2 is applied to an electronic device, an outer edge of the second arc sheet portion 23 covers a top edge or a bottom edge of the middle frame. On this basis, as the height H2 of the second arc sheet portion 23 is less than or equal to 1.5 mm, under a given thickness of the electronic device, such a small height H2 allows the middle frame to be designed thicker, facilitating arrangement of structures such as a USB interface, a speaker sound output hole, and an earphone jack on the top edge and the bottom edge of the frame.

In some embodiments, as shown in FIG. 23, an edge of the inner surface of the second arc sheet portion 23 further away from the inner surface of the flat plate portion 21 is an outer edge of the inner surface of the second arc sheet portion 23. An included angle θ2 between a tangent plane at the outer edge of the inner surface of the second arc sheet portion 23 and the outer surface of the flat plate portion 21 is less than or equal to 89°, Optionally, the included angle θ2 may be 10°, 20°, 25°, 30°, 35°, 40°, 45°, 50°, or the like. In this way, a user can enjoy pictures with a more-3D effect.

In some embodiments, as shown in FIG. 23, a curvature radius R2 of the inner surface of the second arc sheet portion 23 is greater than or equal to 2.5 mm. Optionally, the curvature radius R2 may be 2.5 mm, 3 mm, 3.5 mm, 4 mm, or the like. In this way, the curvature radius R2 of the inner surface of the second arc sheet portion 23 is large, so that a bent angle is small in the case of bending a planar light-transmitting cover plate by hot pressing or other methods to form the second arc sheet portion 23, guaranteeing forming yield of the second arc sheet portion 23. Curvature radii R2 of all parts of the inner surface of the second arc sheet portion 23 may be the same or different, which is not specifically limited in this embodiment of this application.

Figure 24:
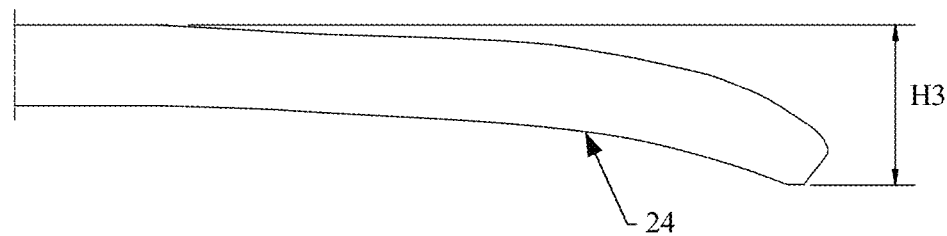
FIG. 24 is a cross-sectional view along line G-G of the light-transmitting cover plate shown in FIG. 19.

In some embodiments, refer to FIG. 24. FIG. 24 is a cross-sectional view along line G-G of the light-transmitting cover plate 2 shown in FIG. 19. The third arc sheet portion 24 has a decreasing thickness from one end connecting to the flat plate portion 21 to the outer contour of the third arc sheet portion 24. In this way, on a basis that an inner surface of the third arc sheet portion 24 fits the third side view portion 14 of the flexible display panel 1, an outer surface of the third arc sheet portion 24 has a larger radian, allowing a user to enjoy pictures with a more-3D effect.

In some embodiments, the third arc sheet portion 24 may alternatively be formed through a combination of hot pressing and CNC, so as to reduce forming difficulty and processing cost of the third arc sheet portion 24.

In some embodiments, as shown in FIG. 24, a height H3 of the third arc sheet portion 24 in the direction perpendicular to the flat plate portion 21 is greater than or equal to 1 mm and less than or equal to 2 mm. In this way, the height H3 of the third arc sheet portion is moderate, avoiding a large upwarp on the middle portion of the outer edge of the third arc sheet portion from affecting a 3D display effect of an electronic device.

As shown in FIG. 17, the display 10 further includes a polarizer 3. The polarizer 3 is disposed on the display face of the flexible display panel 1. The polarizer 3 is made into the same shape as the surface of the flexible display panel 1 and fits the flexible display panel 1 without gaps or wrinkles, so as to form a display panel with the polarizer.

As shown in FIG. 17, the display 10 further includes a light-transmitting adhesive layer 4. The light-transmitting adhesive layer 4 is disposed between the polarizer 3 and the light-transmitting cover plate 2. The light-transmitting adhesive layer 4 includes but is not limited to clear adhesives such as an optionally clear adhesive (optically clear adhesive. OCA) and is configured to bond the display panel with the polarizer to the inner surface 22 of the light-transmitting cover plate 2. When the inner surface 22 of the light-transmitting cover plate 2 does not match the shape of the flexible display panel 1, the light-transmitting adhesive layer 4 has fluidity, so when the display panel with the polarizer is being bonded to the inner surface 22 of the light-transmitting cover plate 2, bonding pressure can be adjusted to enable the light-transmitting adhesive layer 4 to flow from a position with a small gap to a position with a large gap, so that the flexible display panel 1 can be formed as a four-curved shape without wrinkles.

This application further provides an electronic device. The electronic device is a type of electronic device with a display function. Specifically, the electronic device includes but is not limited to a mobile phone, a tablet personal computer (tablet personal computer), a laptop computer (laptop computer), a personal digital assistant (personal digital assistant. PDA), a personal computer, a notebook computer, a vehicle-mounted device, and a wearable device (such as a watch).

Figure 25:
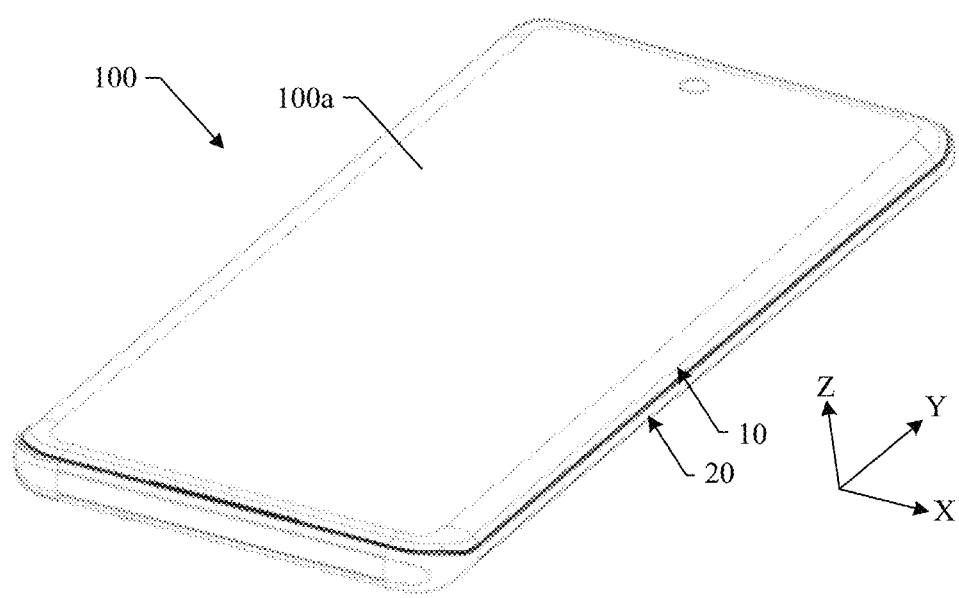
FIG. 25 is a schematic structural diagram of an electronic device according to some embodiments of this application.

Refer to FIG. 25. FIG. 25 is a schematic diagram of an electronic device 100 according to some embodiments of this application. In this embodiment, the electronic device 100 is a mobile phone. Specifically, the electronic 100 includes a display 10, a middle frame 20, a back cover (not shown in the figure) and a circuit board (not shown in the figure). The display 10 is the display 10 described in the foregoing embodiments. The display 10, the middle frame 20, and the back cover are connected in sequence. An inner accommodating space of the electronic device 100 is formed between the middle frame 20 and the back cover, and the circuit board is disposed in the inner accommodating space. In some embodiments, the circuit board is a main board of the mobile phone. In some other embodiments, the circuit board may alternatively be a secondary board of the mobile phone. The circuit board is electrically connected to the flexible display panel of the display 10 to transmit images or information to the flexible display panel.

Because the electronic device provided in this embodiment of this application includes the display 10 described in the foregoing embodiment, the electronic device can implement four-curved display with a high screen-to-body ratio, making the product more competitive.

The specific features, structures, materials, or characteristics described in this specification may be combined in a suitable manner in any one or more embodiments or examples.

In conclusion, it should be noted that the foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of this application.

What is claimed is:

1. A flexible display panel, comprising:
   a main view portion;
   a first side view portion;
   a second side view portion; and
   a third side view portion;
   wherein the first side view portion, the second side view portion and the third side view portion are disposed at an edge of the main view portion;
   wherein the main view portion comprises a middle portion and an edge, wherein the edge of the main view portion comprises a first section, a second section, and a corner section connected between the first section and the second section; and the main view portion comprises a display face and a back face that is back to the display face;
   wherein the first side view portion extends from the first section in a direction leaving the middle portion of the main view portion and bends toward the back face side; the second side view portion extends from the second section in a direction leaving the middle portion of the main view portion and bends toward the back face side; and the third side view portion is connected between the first side view portion and the second side view portion, and the third side view portion extends from the corner section in a direction leaving the middle portion of the main view portion and bends toward the back face side;
   wherein two ends of an outer contour of the third side view portion respectively connect to an outer contour of the first side view portion and an outer contour of the second side view portion, a middle portion of the outer contour of the third side view portion upwarps toward the main view portion in a direction perpendicular to the main view portion to form an apex of the outer contour of the third side view portion, and a perpendicular distance from the apex to the main view portion is greater than the perpendicular distances from the main view portion to where the two ends of the outer contour of the third side view portion respectively connect to the outer contour of the first side view portion and the outer contour of the second side view portion;

wherein the corner section is a transition arc connected between the first section and the second section; and wherein an inner contour of the third side view portion is an arcual shape and is disposed at an edge of the transition arc.

2. The flexible display panel of claim 1, wherein an orthographic projection of the outer contour of the first side view portion on the display face is a first projection; an orthographic projection of the outer contour of the second side view portion on the display face is a second projection; and an orthographic projection of the outer contour of the third side view portion on the display face is a third projection, and the third projection is the transition arc connected between the first projection and the second projection.

3. The flexible display panel of claim 1, wherein an orthographic projection of the third side view portion on the display face is a fourth projection, and an intersection of an extending line of the first section and an extending line of the second section is located within the fourth projection.

4. The flexible display panel of claim 1, wherein a height of the third side view portion in the direction perpendicular to the main view portion is greater than or equal to 0.05 mm and less than or equal to 0.25 mm.

5. The flexible display panel of claim 1, wherein both the first section and the second section are straight sections, and the first section is perpendicular to the second section.

6. The flexible display panel of claim 1, wherein a length of the first section is greater than a length of the second section.

7. A display, comprising:
a light-transmitting cover plate; and
a flexible display panel with a main view portion, a first side view portion, a second side view portion and a third side view portion, wherein the first side view portion, the second side view portion and the third side view portion are disposed at an edge of the main view portion;

wherein the light-transmitting cover plate comprises a flat plate portion, and a first arc sheet portion, a second arc sheet portion, and a third arc sheet portion that are disposed at an edge of the flat plate portion, wherein the flat plate portion comprises a middle portion and an edge, and the edge of the flat plate portion comprises a first edge, a second edge, and a corner edge connected between the first edge and the second edge;

wherein the first arc sheet portion extends from the first edge in a direction leaving the middle portion of the flat plate portion and bends toward an inner side of the flat plate portion; the second arc sheet portion extends from the second edge in a direction leaving the middle portion of the flat plate portion and bends toward the inner side of the flat plate portion; and the third arc sheet portion is connected between the first arc sheet portion and the second arc sheet portion, and the third arc sheet portion extends from the corner edge in a direction leaving the middle portion of the flat plate portion and bends toward the inner side of the flat plate portion;

wherein the flexible display panel is disposed on an inner side of the light-transmitting cover plate; the main view portion of the flexible display panel and the flat plate portion are stacked, and the display face of the main view portion faces toward the flat plate portion; the first side view portion of the flexible display panel and the first arc sheet portion are stacked; the second side view portion of the flexible display panel and the second arc sheet portion are stacked; and the third side view portion of the flexible display panel and the third arc sheet portion are stacked;

wherein two ends of an outer contour of the third arc sheet portion respectively connect to an outer contour of the first arc sheet portion and an outer contour of the second arc sheet portion, and a middle portion of the outer contour of the third arc sheet portion upwarps toward the flat plate portion in a direction perpendicular to the flat plate portion to form an apex of the outer contour of the third arc sheet portion, and a perpendicular distance from the apex to flat plate portion is greater than the perpendicular distances from the flat plate portion to where the two ends of the outer contour of the third arc sheet portion respectively connect to the outer contour of the first arc sheet portion and the outer contour of the second arc sheet portion;

wherein the corner edge is arcual in shape; and wherein an inner contour of the third arc sheet portion is arcual in shaped and is disposed at the corner edge.

8. The display of claim 7, wherein the first arc sheet portion, the second arc sheet portion, and the third arc sheet portion each have a decreasing thickness from one end connecting to the flat plate portion to the outer contour.

9. The display of claim 7, wherein a length of the first arc sheet portion in a direction parallel to the flat plate portion and perpendicular to the first edge and a length of the second arc sheet portion in a direction parallel to the flat plate portion and perpendicular to the second edge both are less than or equal to 6 mm.

10. The display of claim 7, wherein a height of the first arc sheet portion in the direction perpendicular to the flat plate portion is less than or equal to 3.5 mm.

11. The display of claim 7, wherein a height of the second arc sheet portion in the direction perpendicular to the flat plate portion is less than or equal to 1.5 mm.

12. The display of claim 7, wherein an included angle between a tangent plane at an outer edge of an inner surface of the first arc sheet portion and an outer surface of the flat plate portion and an included angle between a tangent plane at an outer edge of an inner surface of the second arc sheet portion and the outer surface of the flat plate portion both are less than or equal to 89°.

13. The display of claim 12, wherein a curvature radius of the inner surface of the first arc sheet portion and a curvature radius of the inner surface of the second arc sheet portion both are greater than or equal to 2.5 mm.

14. The display of claim 7, wherein a height of the third arc sheet portion in the direction perpendicular to the flat plate portion is greater than or equal to 1 mm and less than or equal to 2 mm.

15. An electronic device, comprising a display, a middle frame, a back cover, and a circuit board;
wherein the display, the middle frame, and the circuit board are connected in sequence, an inner accommodating space of the electronic device is formed between the middle frame and the back cover, the circuit board is disposed in the inner accommodating space, and the circuit board is electrically connected to a flexible display panel of the display;

wherein the display, comprising;

a light-transmitting cover plate; and the flexible display panel with a main view portion, a first side view portion, a second side view portion and a third side view portion, wherein the first side view portion, the second side view portion and the third side view portion are disposed at an edge of the main view portion;

wherein the light-transmitting cover plate comprises a flat plate portion, and a first arc sheet portion, a second arc sheet portion, and a third arc sheet portion that are disposed at an edge of the flat plate portion, wherein the flat plate portion comprises a middle portion and an edge, and the edge of the flat plate portion comprises a first edge, a second edge, and a corner edge connected between the first edge and the second edge;

wherein the first arc sheet portion extends from the first edge in a direction leaving the middle portion of the flat plate portion and bends toward an inner side of the flat plate portion; the second arc sheet portion extends from the second edge in a direction leaving the middle portion of the flat plate portion and bends toward the inner side of the flat plate portion; and the third arc sheet portion is connected between the first arc sheet portion and the second arc sheet portion, and the third arc sheet portion extends from the corner edge in a direction leaving the middle portion of the flat plate portion and bends toward the inner side of the flat plate portion;

wherein the flexible display panel is disposed on an inner side of the light-transmitting cover plate; the main view portion of the flexible display panel and the flat plate portion are stacked, and the display face of the main view portion faces toward the flat plate portion; the first side view portion of the flexible display panel and the first arc sheet portion are stacked; the second side view portion of the flexible display panel and the second arc sheet portion are stacked; and the third side view portion of the flexible display panel and the third arc sheet portion are stacked;

wherein two ends of an outer contour of the third arc sheet portion respectively connect to an outer contour of the first arc sheet portion and an outer contour of the second arc sheet portion, and a middle portion of the outer contour of the third arc sheet portion upwarps toward the flat plate portion in a direction perpendicular to the flat plate portion to form an apex of the outer contour of the third arc sheet portion, and a perpendicular distance from the apex to flat plate portion is greater than the perpendicular distances from the flat plate portion to where the two ends of the outer contour of the third arc sheet portion respectively connect to the outer contour of the first arc sheet portion and the outer contour of the second arc sheet portion;

wherein the corner edge is arcual in shape; and wherein an inner contour of the third arc sheet portion is an arcual in shape and disposed at the corner edge.

16. The electronic device of claim 15, wherein the first arc sheet portion, the second arc sheet portion, and the third arc sheet portion each have a decreasing thickness from one end connecting to the flat plate portion to the outer contour.

17. The electronic device of claim 15, wherein a length of the first arc sheet portion in a direction parallel to the flat plate portion and perpendicular to the first edge and a length of the second arc sheet portion in a direction parallel to the flat plate portion and perpendicular to the second edge both are less than or equal to 6 mm.

18. The electronic device of claim 15, wherein a height of the first arc sheet portion in the direction perpendicular to the flat plate portion is less than or equal to 3.5 mm.

19. The electronic device of claim 15, wherein a height of the first arc sheet portion in the direction perpendicular to the flat plate portion is less than or equal to 3.5 mm.

20. The electronic device of claim 15, wherein a height of the second arc sheet portion in the direction perpendicular to the flat plate portion is less than or equal to 1.5 mm.

* * * * *